(12) United States Patent
Lieten et al.

(10) Patent No.: US 7,964,482 B2
(45) Date of Patent: Jun. 21, 2011

(54) DEPOSITION OF GROUP III-NITRIDES ON GE

(75) Inventors: Ruben Lieten, Zonhoven (BE); Stefan Degroote, Scherpenheuven-Zichem (BE)

(73) Assignees: IMEC, Leuven (BE); Vrije Universiteit Brussel, Brussels (BE)

( * ) Notice: Subject to any disclaimer, the term of this patent is extended or adjusted under 35 U.S.C. 154(b) by 142 days.

(21) Appl. No.: 12/309,939

(22) PCT Filed: Jul. 9, 2007

(86) PCT No.: PCT/EP2007/006050
§ 371 (c)(1),
(2), (4) Date: Feb. 2, 2009

(87) PCT Pub. No.: WO2008/011979
PCT Pub. Date: Jan. 31, 2008

(65) Prior Publication Data
US 2009/0189192 A1    Jul. 30, 2009

Related U.S. Application Data

(60) Provisional application No. 60/834,257, filed on Jul. 27, 2006.

(30) Foreign Application Priority Data

Mar. 21, 2007   (EP) ..................................... 07005755

(51) Int. Cl.
*H01L 21/20* (2006.01)
*H01L 21/36* (2006.01)

(52) U.S. Cl. ........ 438/503; 257/189; 257/200; 257/615; 257/E21.098; 257/E29.089; 438/483; 438/492; 438/604

(58) Field of Classification Search ................... 257/189, 257/200, 615, E21.098, E29.089; 438/495
See application file for complete search history.

(56) References Cited

U.S. PATENT DOCUMENTS 6,518,602 B1 *   2/2003   Yuasa et al. .................. 257/102
(Continued)

FOREIGN PATENT DOCUMENTS
EP        1 548 807 A1      6/2005
(Continued)

OTHER PUBLICATIONS

Siegle et al., "High-quality GaN growth by molecular beam epitaxy on Ge(001)," Mat. Res. Soc. Symp. Proc., Vo. 542, (1999), 451.
(Continued)

*Primary Examiner* — Asok K Sarkar
(74) *Attorney, Agent, or Firm* — Knobbe Martens Olson & Bear LLP

(57) ABSTRACT

The present invention provides a method for depositing or growing a group III-nitride layer, e.g. GaN layer (5), on a substrate (1), the substrate (1) comprising at least a Ge surface (3), preferably with hexagonal symmetry. The method comprises heating the substrate (1) to a nitridation temperature between 400° C. and 940° C. while exposing the substrate (1) to a nitrogen gas flow and subsequently depositing the group III-nitride layer, e.g. GaN layer (5), onto the Ge surface (3) at a deposition temperature between 100° C. and 940° C. By a method according to embodiments of the invention, a group III-nitride layer, e.g. GaN layer (5), with good crystal quality may be obtained. The present invention furthermore provides a group III-nitride/substrate structure formed by the method according to embodiments of the present invention and a semiconductor device comprising at least one such structure.

30 Claims, 10 Drawing Sheets

U.S. PATENT DOCUMENTS 7,352,015 B2 * 4/2008 Piner et al. .................... 257/190
2005/0211988 A1 * 9/2005 Leycuras ........................ 257/77

FOREIGN PATENT DOCUMENTS

EP  1 583 139 A1  10/2005

OTHER PUBLICATIONS

Trybus et al., "Growth of InN on Ge substrate by molecular beam epitaxy," Journal of Crystal Growth 279, (2005), 311-315.

* cited by examiner

DEPOSITION OF GROUP III-NITRIDES ON GE

CROSS-REFERENCE TO RELATED APPLICATIONS

This application is the national phase under 35 U.S.C. §371 of PCT International Application No. PCT/EP2007/006050 which has an International filing date of Jul. 9, 2007, which designates the United States of America and which claims priority to U.S. Provisional Application No. 60/834,257 filed Jul. 27, 2006, the disclosures of each of which are hereby incorporated by reference in their entireties.

TECHNICAL FIELD OF THE INVENTION

The invention relates to the deposition of group III-nitrides on a substrate. More specifically the invention relates to a method for depositing or growing group III-nitrides, such as e.g. GaN, on a Ge substrate. The Ge substrate may have at least a Ge surface with hexagonal symmetry. The present invention also relates to a device comprising a group III-nitride layer, such as a GaN layer, on a substrate having at least a Ge surface, the device being formed by using a method according to the present invention.

BACKGROUND OF THE INVENTION

Group III-Nitrides have gained a lot of importance for the last decade, for example in semiconductor processing. Examples of applications are High Electron Mobility Transistors (HEMT) for high power and high frequency applications, blue LEDs, etc.

Because monocrystalline group III-Nitride substrates are not commercially available so far, a lot of effort has been put in optimizing growth of such group III-nitrides on appropriate substrates. The most commonly used substrates for growing group III-nitrides on are silicon, sapphire and silicon carbide. However, the growth or deposition of group III-nitride on these substrates suffers from large lattice and thermal mismatches, making the growth of high crystal quality material difficult. Table 1 shows material properties of commonly used substrates for group III-Nitride growth, as well as theoretical thermal and lattice mismatches with respect to GaN. Also shown in this table are the properties of Ge and the corresponding theoretical lattice and thermal mismatch with GaN.

Because of the high thermal mismatch between GaN and Silicon Carbide (SiC) or Silicon (Si) substrates, the growth of GaN on these substrates results in high tensile thermal stress which may lead to the formation of cracks in the GaN layer after cooling down. Especially in the case of Si substrates, a buffer layer between GaN and Si has to be implemented to accommodate for the tensile thermal stress.

Before the growth of GaN on the above mentioned Si or SiC substrates, an extra or intermediate layer is required. For example, GaN cannot be grown directly on Si, because of the occurrence of an etching reaction between the Si of the substrate and the Ga atoms of the GaN layer deposited on the Si substrate. Therefore an extra layer, for example an AlN layer, is grown in between GaN and Si. According to another example, because wetting properties of GaN on SiC are not good, first AlN is grown on the SiC substrate before GaN is deposited on that substrate. The presence of AlN on SiC also reduces the lattice mismatch between GaN which is later on deposited and the SiC substrate and improves the wetting properties. Hence, AlN grows better on SiC than GaN, because of better wetting properties. Without an intermediate layer, GaN grows 3-dimensionally on SiC.

In case of Sapphire substrates, the introduced stress is also large but compressive. Nevertheless, compressive stress can also lead to the formation of cracks in the substrate. Direct growth of GaN with good crystal quality on sapphire is not possible.

Furthermore, Sapphire and Silicon Carbide are difficult to heat up uniformly, because of the high bandgap of respectively 8 eV and 2.36 eV. The bandgap of Silicon, which is 1.12 eV, allows uniform heating, but a high temperature is needed to remove the native oxide layer.

In EP 1 548 807 deposition of group III-nitride material onto a silicon substrate with a porous top layer has been described. An intermediate layer comprising Ge, preferably with a Ge concentration which is increasing in a direction away from the substrate, is first provided onto the substrate before a layer of a group III-nitride material is provided onto the substrate. The Ge-comprising intermediate layer may preferably be SiGe. The Ge-comprising intermediate layer is used to reduce the thermal stress and is a protective layer against oxidation and nitridation of the porous top Si layer. The porous top Si layer reduces the large lattice mismatch between the Si and the group III-nitride.

TABLE 1

Material properties of GaN, Sapphire, 6-HSiC, Si(111), Ge(111), AlN, GaN, InN and a reference Ge(111). The lattice and thermal mismatches are given with respect to GaN.

| Material | Lattice constant a (Å) | Lattice mismatch to GaN (%) | Thermal Expansion coefficient (10-6 K-1) | Thermal mismatch to GaN (%) | Thermal Conductivity (W/cmK) | Bandgap (eV) |
|---|---|---|---|---|---|---|
| GaN (reference) | 3.19 | 0.0 | 5.6 | 0 | 1.3 | 3.39 |
| Sapphire | 2.75 | 16.0 | 7.5 | −34 | 0.33 | 8.0 |
| 6-HSiC | 3.08 | 3.5 | 4.2 | 25 | 4.9 | 2.36 |
| Si(111) | 3.84 | −16.9 | 2.6 | 54 | 1.3 | 1.12 |
| Ge(111) | 4.00 | −20.3 | 5.9 | −5.5 | 0.58 | 0.66 |
| AlN | 3.11 | −22.3 | 4.2 | −28.8 | 2.0 | 6.0 |
| GaN | 3.19 | −20.3 | 5.6 | −5.5 | 1.3 | 3.39 |
| InN | 3.53 | −11.8 | 3.8 | −35.6 | 0.54 | 0.6-0.8 |
| Ge(111) (reference) | 4.00 | | 5.9 | | 0.58 | 0.66 |

The method described in EP 1 548 807 thus requires deposition of an extra layer onto the substrate before a group III-nitride can be deposited onto the substrate.

However, the use of buffer or intermediate layers forms a barrier between the material of the substrate and the nitride layer. This may be a disadvantage when the group III-nitride/substrate structure is intended to be used in e.g. semiconductor devices.

From table 1 it can be seen that the thermal mismatch between GaN and Ge is −5.5%, which is small compared to the other substrates mentioned in the table. For group III-nitrides such as e.g. GaN, InN and AlN the thermal expansion coefficients are respectively 5.6, 3.8 and 4.2. GaAs has a thermal expansion coefficient of 5.7 and Ge has a thermal expansion coefficient of 5.9. Hence, for minimising the thermal mismatch, GaN may be the best choice to grow on Ge. Also GaAs would be a good substrate with Ge on top to grow GaN on. Hence, using Ge as a substrate to deposit GaN on, or in general to deposit a group III-nitride on, would result in limited additional thermal stress during cooling down after growth. This is especially the case for nitrides that contain a high Ga concentration.

The growth of group III-nitrides, and especially of GaN, on a Ge substrate would be interesting for different reasons. For example, as already mentioned above there is a small thermal mismatch between group III-nitride, such as GaN or InGaN and AlGaN with high Ga content, and Ge. Furthermore, Ge has a relatively low price. Furthermore, Ge has a low bandgap (0.66 eV) and can be heated up uniformly and reproducibly in a deposition system using radiative heating, for example molecular beam epitaxy (MBE). The possibility for uniform heating of the Ge substrate may be advantageous during deposition of the group III-nitride layer onto the substrate to form uniform layers of group III-nitride material, e.g. GaN, with good crystal quality. However, a problem that arises is that the lattice mismatch between Ge and group III-nitrides, e.g. GaN, is larger than in case of commonly used substrates such as Silicon, Sapphire or Silicon Carbide. A large lattice mismatch can lead to growth of group III-nitrides, e.g. GaN, with bad crystal quality, which cannot be used in semiconductor devices.

In "Journal of Crystal Growth, 279, (2005), p. 311" E. Trybus et al. describe the growth of InN on a Ga-doped Germanium (111) substrate via plasma assisted molecular beam epitaxy. A lattice mismatch of 11.3% was observed between the InN layer and the Ga-doped Ge(111) substrate. The crystallographic structures of the InN layer formed were studied with double-crystal X-ray diffraction (XRD). The best obtained full width at half maximum (FWHM) values for InN were ~144 arcseconds and the best rocking curve measurements showed ~2597 arcseconds FWHM, indicating significant tilt and mosaic grain structure. Furthermore, it was shown by diffraction contrast microscopy measurements that a 0.4 µm thick InN film contains a high density of threading dislocations and grain boundaries.

In the InN/Ge structure formed in the above-described document, a high lattice mismatch exists between the InN layer and the Ge substrate. Such a high lattice mismatch may lead to many defects. For example a thermal mismatch between InN and Ge of −36% can lead to additional stress of the InN layer after deposition, e.g. during cooling down. Furthermore, the InN/Ge structures formed show a rough interface between the InN layer and the Ge substrate. Probably this is due to mixing of the Ge and the InN because of an eutectic reaction between In and Ge. The FWHM of the XRD omega-2theta scan is ~144 arcseconds, and the rocking curve FWHM~2597 arcseconds. The latter shows the relatively poor crystal quality of InN directly grown on Ge(111) when compared to values of less than 300 arcseconds for InN grown on sapphire. Direct growth of good quality InN on Ge may thus be difficult because of the eutectic reaction between In and Ge. Because of this, these structures are less suitable to be used in e.g. semiconductor devices.

Up till now, no satisfactory methods have been developed for depositing group-III nitrides and especially GaN onto a Ge substrate in a cost-effective way and such that the group III-nitride/Ge structures formed are suitable for use in e.g. semiconductor devices.

SUMMARY OF THE INVENTION

It is an object of embodiments of the present invention to provide a good method for depositing group III-nitrides, e.g. GaN, on a substrate comprising at least a Ge surface. The Ge surface may have hexagonal or six-fold symmetry. It is a further object of embodiments of the present invention to provide a device formed by the method according to embodiments of the invention.

An advantage of a method according to embodiments of the present invention is that it does not require the deposition of intermediate layers, i.e. layers in between the group III-nitride layer, e.g. GaN layer, and the substrate, e.g. Ge substrate or substrate comprising at least a Ge surface, and hence, processing time and processing costs can be decreased.

Furthermore, group III-nitride/Ge structures formed by the method according to the invention are suitable to be used in semiconductor devices.

In an aspect, the present invention provides a method for depositing a group III-nitride layer, e.g. GaN layer, on a substrate, the substrate comprising at least a Ge surface. The method comprises heating the substrate to a temperature below the Ge melting temperature, e.g. a temperature between 400° C. and 940° C., and depositing a group III-nitride layer, e.g. GaN layer, onto said Ge surface.

In an aspect, the present invention provides a method for depositing a group III-nitride layer, e.g. GaN layer, on a substrate, the substrate comprising at least a Ge surface. The Ge surface may have hexagonal or six-fold symmetry. The method comprises, in a first step before depositing the group III-nitride layer, e.g. GaN layer, heating the substrate to a nitridation temperature between 400° C. and 940° C. while a nitridation step is performed by exposing the substrate to a nitrogen gas flow. As $N_2$ gas atoms are too stable to bind to the surface, it is advantageous to split the nitrogen molecules from the nitrogen gas flow into atomic nitrogen atoms. Hence, the nitridation step is performed by exposing the substrate to an atomic nitrogen beam. Hereby, a GeN layer is formed on top of the Ge surface. Subsequently, a group III-nitride layer, e.g. GaN layer is deposited onto the so-formed GeN layer. For this deposition step, the substrate may, depending on the nitridation temperature, be heated or cooled down to a deposition temperature between 100° C. and 940° C. at which the group III-nitride, e.g. GaN, is deposited on the substrate.

The GeN layer formed on the Ge surface of the substrate by nitridation of the Ge surface before deposition of the group III-nitride layer allows the group III-nitride layer to fit on top of a Ge surface which has a hexagonal symmetry. In case of GaN growth onto an on-axis Ge surface a rotation of the GaN lattice with 4 degrees in the plane of the growth surface further facilitates the fitting of the GaN on top of the Ge surface of the substrate. The rotation is driven by the minimisation of surface and interface energy between the GaN and Ge (see further).

Furthermore, the method according to embodiments of the invention does not require an extra step of depositing an additional layer in between the group III-nitride layer, e.g. GaN layer, and the substrate.

The nitridation step in the method according to the invention may be performed in a same deposition chamber as the deposition of the group III-nitride layer, e.g. GaN layer. Moreover, no extra provisions have to be taken because a nitrogen gas flow provision means is present anyhow as it is also used during deposition of the group III-nitride layer, e.g. GaN layer.

Because of the above, the method according to embodiments of the invention is a cost-effective method, which may be important in e.g. semiconductor processing.

According to embodiments of the invention, the substrate may be formed of any suitable material with on top a Ge layer forming a Ge surface, preferably with hexagonal or six-fold symmetry of the substrate, for example GaAs with on top a Ge layer or Si with on top a Ge layer. According to other embodiments of the invention, the substrate may be formed of a Ge bulk substrate with on top a Ge layer forming a Ge surface, preferably with hexagonal or six-fold symmetry of the substrate. The substrate may also be completely formed of Ge, preferably with hexagonal or six-fold symmetry.

The substrate may comprise a Ge(111) or off-cut Ge(111) surface layer with hexagonal symmetry. According to embodiments of the invention, the substrate may comprise a support comprising such a Ge(111) layer or an off-cut Ge(111) layer on top of it. The support can, for example, be Si, SiC, sapphire ($Al_2O_3$), off cut Si(111), GaAs, off cut GaAs(111) or can comprise Si, SiC, sapphire ($Al_2O_3$), off-cut Si(111), GaAs. The thickness of the Ge(111) layer or said off-cut Ge(111) layer on top of the support can vary between 0.4 nm and 500 μm.

According to embodiments of the invention, the nitridation temperature may preferably be chosen between 550° C. and 850° C.

According to further embodiments of the invention, the deposition temperature may be chosen between 550° C. and 850° C.

According to embodiments of the invention, the nitridation and deposition temperatures may be chosen to be equal to each other. However, according to other embodiments of the invention, the nitridation and deposition temperatures may be chosen to be different from each other.

According to embodiments of this aspect of the invention the GaN layer may be deposited by molecular beam epitaxy (MBE). The deposition temperatures used in MBE are lower than the melting point of Ge which is 940° C.

According to another embodiment, the thickness of the group III-nitride layer, e.g. GaN layer, may be chosen to be between 0.5 nm and 100 μm. The thickness of the group III-nitride layer, e.g. GaN layer, depends on the deposition temperature and the deposition rate.

According to embodiments of the invention, the method may furthermore comprise doping the group III-nitride layer, e.g. GaN layer. This may be done by introducing foreign elements into the group III-nitride layer, e.g. GaN, during growth or afterwards, by, for example, ion implantation. Examples of suitable elements for doping in case of GaN are Si for forming n-type GaN or Mg for forming p-type GaN.

According to further embodiments, the method may furthermore comprise patterning the group III-nitride layer, e.g. GaN layer, after having removed the formed group III-nitride/Ge structure, e.g. GaN/Ge structure, from the deposition chamber. This may be done by any suitable technique known by a person skilled in the art, such as e.g. lithography.

According to another embodiment of the first aspect, at least one extra layer, which may afterwards be patterned or not, may be deposited on the group III-nitride layer, e.g. GaN layer, which is formed on the substrate comprising at least a Ge surface, with preferably hexagonal symmetry. This may be done in the same deposition chamber as where the group III-nitride, e.g. GaN, was deposited but may also be done by other techniques known by a person skilled in the art. According to embodiments of the invention, only one extra layer may be deposited on the group III-nitride layer, e.g. GaN layer. However, according to other embodiments of the invention, a plurality of extra layers with e.g. different functionalities may be deposited on the group III-nitride layer, e.g. GaN layer.

The at least one extra layer may, for example, be a group III-nitride material, a III-V material, an oxide, a metal, a semiconductor material or an insulator such as e.g. SiN, SiO, $Al_2O_3$, organic insulating materials, etc. . . . The at least one extra layer may also be formed of a combination of more than one of the previous cited materials. For example, the at least one extra layer may comprise AlN, InN, AlGaN, InGaN, InAlGaN, AlGaN with an Al concentration below 50% InGaN with an In concentration above 25%. According to embodiments of the present invention, InGaN or $In_xGa_{1-x}N$, InAlGaN or $In_xAl_yGa_{1-x-y}N$ and AlGaN or $Al_xGa_{1-x}N$ with any content of Ga and In or Al may be used to form the at least one extra layer.

The present invention also provides the use of a method according to embodiments of the invention in semiconductor processing.

Furthermore, the present invention provides the use of a method according to embodiments of the invention for forming a heterojunction diode.

In another aspect of the invention a structure is provided comprising:
- a substrate comprising at least a Ge surface, preferably with hexagonal symmetry,
- a group III-nitride layer, e.g. GaN layer, and
- a GeN layer in between the substrate and the group III-nitride layer, e.g. GaN layer, the GeN layer being in direct contact with the Ge surface with hexagonal symmetry and with the group III-nitride layer, e.g. GaN layer.

According to embodiments of the invention, the substrate may be formed of a bulk substrate, also referred to as support, comprising any suitable material with on top a Ge layer forming a Ge surface, preferably with hexagonal or six-fold symmetry of the substrate, for example GaAs with on top a Ge layer or Si with on top a Ge layer. According to other embodiments of the invention, the substrate may be formed of a Ge bulk substrate with on top a Ge layer forming a Ge surface, preferably with hexagonal or six-fold symmetry of the substrate. The substrate may also be completely formed of Ge, preferably with hexagonal or six-fold symmetry.

The substrate may comprise a Ge(111) or off-cut Ge(111) surface layer with hexagonal symmetry. According to embodiments of the invention, the substrate may comprise a support comprising such a Ge(111) layer or an off-cut Ge(111) layer on top of it. The support can, for example, be Si, SiC, sapphire ($Al_2O_3$), off cut Si(111), GaAs, off-cut GaAs(111) or can comprise Si, SiC, sapphire ($Al_2O_3$), off-cut Si(111), GaAs, off cut GaAs(111). The thickness of the Ge(111) layer or said off-cut Ge(111) layer can vary between 0.4 nm and 500 μm.

The thickness of the group III-nitride layer, e.g. GaN layer, may be between 0.5 nm and 100 μm. According to embodiments where the group III-nitride is GaN, the full width at half maximum (FWHM) of the x-ray diffraction (XRD) omega scan of the GaN layer may preferably be below 700 arcseconds. However, according to embodiments of the invention, GaN layers with a higher FWHM are also included in the invention. When the group-III nitrides are formed by e.g. AlN or InN, the layers may have lower quality than GaN layers. AlGaN or $Al_xGa_{1-x}N$, InGaN or $In_xGa_{1-x}N$, and InAlGaN or $In_xAl_yGa_{1-x-y}N$ with high In or Al content, i.e. with about 30% In or Al, will also have lower quality than GaN layers formed by the method according to embodiments of the invention. AlGaN layers with low Al content formed by the method according to embodiments of the invention may have as good or even better properties than GaN layers formed by the method according to embodiments of the invention onto a substrate with at least a Ge surface.

According to embodiments of the invention, the group III-nitride layer, e.g. GaN layer, may be patterned.

According to another embodiment, at least one extra layer may be present on top of the group III-nitride layer, e.g. GaN layer. Only one layer may be present or a plurality of layers on top of each other, each having e.g. a different functionality, may be present.

The at least one extra layer may, for example, comprise a group III nitride material, a III-V materials, an oxide, a metal, a semiconductor material or an insulator such as e.g. SiN, SiO, $Al_2O_3$, organic insulating materials, . . . . For example, the at least one extra layer may comprise AlN, InN, AlGaN, InGaN or $In_xGa_{1-x}N$, InAlGaN or $In_xAl_yGa_{1-x-y}N$ or $Al_xGa_{1-x}N$, AlGaN or $Al_xGa_{1-x}N$ with a low Al concentration (below 50%), InGaN or $In_xGa_{1-x}N$ with a high In concentration (higher than 25%) or they can comprise AlN, InN, AlGaN or $Al_xGa_{1-x}N$, InGaN or $In_xGa_{1-x}N$, InAlGaN or $In_xAl_yGa_{1-x-y}N$, AlGaN or $Al_xGa_{1-x}N$ with a low Al concentration (below 50%), InGaN with a high In concentration (higher than 25%). According to embodiments of the present invention, AlGaN or $Al_xGa_{1-x}N$, InGaN or $In_xGa_{1-x}N$, and InAlGaN or $In_xAl_yGa_{1-x-y}N$ with any content of Ga and In or Al may be used to form the at least one extra layer.

The at least one extra layer may, according to embodiments of the invention, be patterned. In another embodiment, when the at least one extra layer is a crystalline layer, the FWHM of the x-ray diffraction (XRD) omega scan of the at least one extra layer may preferably be below 700 seconds.

In a further aspect of the invention a semiconductor device is provided comprising at least one structure formed by the method according to embodiments of the invention.

According to specific embodiments, the semiconductor device may be a heterojunction diode or may be a Heterojunction bipolar transistor (HBT), or may be a direct photoelectrolysis cell.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1A:
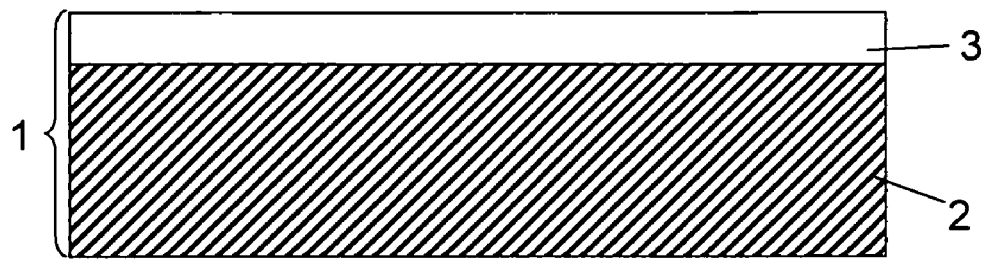
FIG. 1A to FIG. 1C illustrate subsequent steps in a method according to embodiments of the invention.

In the different figures, the same reference signs refer to the same or analogous elements.

DETAILED DESCRIPTION

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Moreover, the terms top, bottom and the like in the description and the claims are used for descriptive purposes and not necessarily for describing relative positions. The terms so used are interchangeable under appropriate circumstances. The embodiments of the invention described herein can operate in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practised without these specific details. In other instances, well-known methods, structures and techniques have not been shown in detail in order not to obscure an understanding of this description.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

The present invention provides a method for depositing a group III-nitride layer, such as a gallium nitride (GaN) layer, onto a substrate with at least a Germanium (Ge) top layer in a cost-effective way. To overcome the symmetry problem between hexagonal group III-nitrides, e.g. GaN, and a cubic substrate, according to the invention, at least a top surface of the Ge top layer should have a hexagonal or six-fold symmetry. With top surface is meant that side of the Ge top layer onto which the group III-nitride layer, e.g. GaN layer, has to be deposited.

In an aspect, the method comprises heating the substrate to a temperature below the Ge melting temperature, e.g. a temperature between 400° C. and 940° C., and depositing a group III-nitride layer, e.g. GaN layer, onto said Ge surface.

In another aspect, the method according to embodiments of the present invention comprises heating the substrate to a deposition temperature of between 400° C. and 940° C., preferably between 550° C. and 850° C., while exposing the substrate to a nitrogen gas flow. Subsequently, a group III-nitride layer, e.g. GaN layer, is deposited onto the Ge surface at a deposition temperature of between 100° C. and 940° C., preferably between 550° C. and 850° C. Any or all of the above actions may be performed in a deposition chamber of a processing tool.

Embodiments of the invention disclose any group III-nitride that can be deposited onto a substrate such as e.g. GaN, AlN, InN, . . . . According to embodiments of the present invention, group III-nitrides also include group III-nitride alloys such as InGaN, AlGaN, InAlGaN, . . . . It has to be noted that anywhere in the description where is referred to InGaN, AlGaN, InAlGaN, respectively $Al_xGa_{1-x}N$, $In_xGa_{1-x}N$, and $In_xAl_yGa_{1-x-y}N$ are meant with any content of Ga and In and/or Al. In the following description, the invention will be described by means of a GaN layer. It has to be understood that this is only for the ease of explanation and that this is not intended to limit the invention in any way. The invention also applies for other group III-nitrides and group III-nitride alloys as indicated above.

According to embodiments of the invention, the substrate may be formed of any suitable material, also referred to as support, with on top a Ge layer having at least a Ge top surface with hexagonal or six-fold symmetry of the substrate, for example GaAs with on top a Ge layer or Si with on top a Ge layer. In embodiments of the present invention, the term "support" may include any underlying material or materials that may be used, or upon which a device, a circuit or an epitaxial layer may be formed. In other alternative embodiments, this "support" may include a semiconductor substrate such as e.g. a doped or undoped silicon, a gallium arsenide (GaAs), a gallium arsenide phosphide (GaAsP), an indium phosphide (InP) or a silicon germanium (SiGe) on silicon substrate. Also group III-nitrides grown on Sapphire or Si, such as e.g. GaN on Sapphire or GaN on Si, with one or more interlayers, such as e.g. AlN, may be used as support. The "support" may also include for example an insulating layer such as a $SiO_2$ or an $Si_3N_4$ layer in addition to a semiconductor substrate portion. Thus, the term "support" also includes silicon-on-glass, silicon-on sapphire substrates. The term "support" is thus used to define generally the elements for layers that underlie a layer or portions of interest. Also, the "support" may be any other base on which a layer is formed, for example a glass, plastic or metal layer. A Ge layer with at least a top portion of hexagonal or six-fold symmetry may be provided on the support.

According to other embodiments of the invention, the substrate or support may be formed of a Ge bulk substrate with on top a Ge layer having a hexagonal or six-fold symmetry of the substrate. The substrate may also be completely formed of Ge with hexagonal or six-fold symmetry.

For example, according to embodiments of the invention, Ge substrates with at least a six-fold or hexagonal symmetry at the surface can be used, such as Ge(111) substrates or off-cut Ge(111), i.e. off-oriented Ge(111) or tilted Ge(111). The off-cut angle may preferably be between 0° and 15°, or between 2° and 10°, between 4° and 8°, or between 4° and 6°, such as for example 2°, 4°, 4.7°, 6°, 8°. The Ge may also be doped with suitable dopants, for example Ga.

According to other embodiments, the substrate may comprise a bulk Ge support comprising a top layer of Ge with hexagonal symmetry at least at the surface on top of other substrates (for example Si or SiC) can be used. With top layer is meant a layer at that side of the bulk Ge support on which GaN has to be deposited. The top layer of Ge may for example be a Ge(111) top layer or Off-cut or tilted Ge(111) top layer. For example a Silicon or SiC substrate with a Ge top layer, the Ge(111) top layer having a hexagonal or six-fold symmetry may be used as a substrate according to embodiments of the invention.

In embodiments of the invention where the substrate comprises a support with a Ge top layer, the thickness of the Ge top layer may be between 0.4 nm and 500 micron, for example between 5 nm and 500 micron, between 0.4 nm and 100 micron, between 10 nm and 100 micron, between 100 nm and 10 micron, between 500 nm and 1000 nm.

It has to be noted that Ge has a melt temperature of 940° C. Therefore, deposition or growth of GaN onto a substrate comprising at least a Ge top layer by using actual metalorganic chemical vapour deposition (MOCVD) may not be the best choice because the optimum deposition temperature in existing MOCVD processes is too high, i.e. it is higher than 940° C. Recently, molecular beam epitaxy (MBE) for use in GaN deposition or growth was developed. Deposition temperatures during MBE are in the range of between 400° C. and 900° C., which is below the melt temperature of Ge and thus MBE is suitable for use with the method according to embodiments of the present invention. Different types of MBE deposition are known and can be used with the method according to embodiments of the present invention. Examples are plasma-assisted MBE or ammonia MBE. In principle, any known deposition technique working at temperatures below the melt temperature of Ge (940° C.) can be used for depositing GaN onto Ge according to embodiments of the present invention.

Figure 1B:
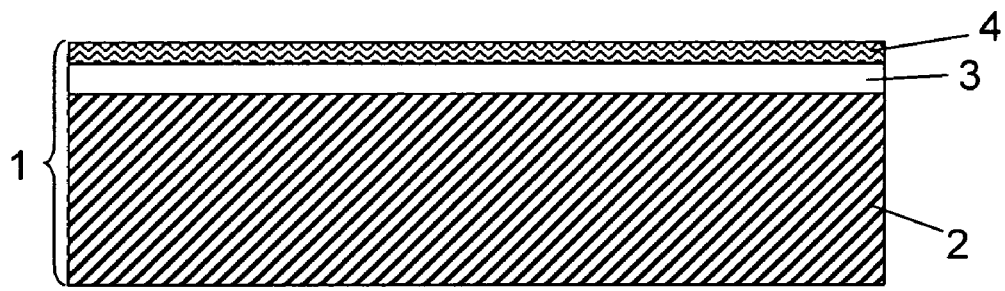
Figure 1C:
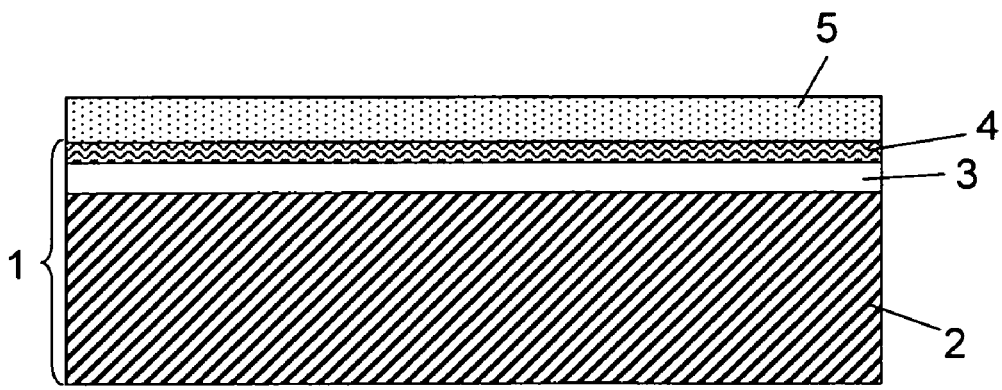

Subsequent steps in the method according to embodiments of the invention are illustrated in FIG. 1A to FIG. 1C. It has to be understood that these drawings are for the purpose of explaining the method and are not intended to limit the invention in any way.

In the example illustrated in FIG. 1A the substrate 1 may be formed by a support 2 with a Ge top layer 3, the Ge top layer 3 having a hexagonal or six-fold symmetry, at least at its top surface away from the support 2.

According to the invention, prior to GaN growth, a nitridation step of the Ge top layer is performed, i.e. the Ge top layer 3 is exposed to a nitrogen gas flow at sufficiently high temperature, i.e. at temperatures between 400° C. and 940° C. As $N_2$ gas atoms are too stable to bind to the surface 3 of the substrate 1, the nitrogen molecules from the nitrogen gas flow are split into atomic nitrogen atoms. For example, when plasma assisted MBE is used, the nitrogen molecules from the nitrogen gas flow are split into atomic nitrogen atoms. In the case of ammonia MBE, $NH_3$ is split at the substrate or in a cell by increased temperature into atomic nitrogen. This allows Ge atoms of at least one upper layer of the Ge top layer 3 to be transformed into GeN, thereby forming a thin GeN layer 4 on the Ge top layer 3 of the substrate 1 (see FIG. 1B). The thin GeN layer 4 may have a thickness of between 0.1 nm and 100 nm, preferably between 0.1 nm and 5 nm and most preferably between 0.1 nm and 2 nm. The thickness of the GeN layer 4 is determined by the duration and temperature of the nitridation step and by the nitrogen gas flow during the nitridation step (see further). From Reflection High Energy Electron Diffraction (RHEED) experiments it can be seen that during nitridation a reorganisation occurs at the surface of the substrate 1. This is reflected by the presence of intermediate streaks in between Ge streaks in the RHEED diffraction pattern. During nitridation the distance between the main Ge streaks does not change, this shows that the formed GeN takes over the same in-plane lattice parameters as the underlying Ge top layer 3. These lattice parameters are different from lattice parameters for known stable GeN phases. Therefore it may be concluded that this GeN layer 4 is not stable but metastable and therefore the thickness of this GeN layer 4 may be limited. When the GeN layer 4 becomes too thick, the GeN takes over the lattice parameters of stable GeN which would not be useful to grow GaN on. More information about stable GeN phases can be found in "Production of Nitrides on the surface of monocrystalline Ge", by V. F. Synorov et al. in Soviet Physics Journal, vol. 10, No. 3, p. 7-11 (1967).

The presence of the GeN layer 4 enables crystalline growth of GaN in the next step of the method according to the invention (see further). The temperature during exposure of the substrate 1 to the nitrogen gas flow, also called nitridation temperature, may be between 400° C. and 940° C., or between 550° C. and 850° C., or between 700° C. and 800° C. and may, for example, be 700° C. The time period during which the Ge top layer 3 of the substrate 1 is exposed to the nitrogen gas flow, also referred to as exposure time, may depend on the nitridation temperature and on flow parameters of the nitrogen gas flow. The nitrogen gas flow may preferably be between 1 sccm and 2 sccm (Standard Cubic Centimeters per Minute). However, a nitrogen gas flow of higher than 2 sccm or lower than 1 sccm may also be used in the method according to embodiments of the invention. Preferably, the exposure time may vary between 1 sec and 30 min, preferably between 30 sec and 2 min, and may, for example, be 60 sec. However, according to other embodiments of the invention, shorter or longer exposure times may be used depending on the nitrogen gas flow and nitridation temperature. When, for a given nitrogen gas flow, the exposure time is too short a layer 4 of GeN will not be formed. On the other hand, when, for a given nitrogen gas flow, the exposure time is too long, the surface of the GeN layer 4 may become rough. This may lead to bad quality of GaN layers subsequently deposited onto the rough GeN layer 4 and of the interface between the GeN layer 4 and the subsequently deposited GaN layer, though which the GaN/substrate structures will be less suitable for being used in e.g. semiconductor devices.

By controlling the nitrogen gas flow, the temperature at which nitridation is performed and the time during which nitridation is performed, the properties such as e.g. thickness of the GeN layer 4 may be well controlled. By controlling the nitridation parameters, the GeN layer 4 formed on the substrate 1 may have a smooth surface. With smooth surface is meant that the roughness of the GeN surface may preferably be not higher than 2 nm, preferably not higher than 1 nm and may preferably be 0.4 nm. The smooth surface of the GeN layer 4 makes sure that the GaN layer which is deposited subsequently will have good crystal quality (see further).

After the formation of the GeN layer 4 by exposing the substrate 1 to a nitrogen gas flow as described above, a layer 5 of GaN is deposited onto the GeN layer 4 (see FIG. 1C). This is done by simultaneously exposing the substrate 1 to a nitrogen gas flow and a Ga flux while heating the substrate 1. Preferably, the Nitrogen gas flow and Ga flux may have a comparable atomic flux. In other words, the atomic ratio of the nitrogen gas flow and the Ga flux may be 1/1. This may lead to good crystal quality because the atomic ratio Ga and N in the deposited GaN layer 5 may also be 1/1 and fewer defects may be present in the lattice of the deposited GaN layer 5 than when the atomic ratio of the nitrogen gas flow and the Ga flux would be different from 1/1. Nevertheless, according to embodiments of the invention, a nitrogen or Ga excess flux or nitrogen and Ga flux with an atomic ratio different from 1/1 may be used as well. During deposition of the GaN layer 5, the substrate 1 is heated to a deposition temperature which may be between 100° C. and 940° C., between 400° C. and 940° C., preferably between 550° C. and 850° C. and which may, for example, be 700° C. During deposition, the pressure in the deposition chamber may be between $10^{-6}$ Torr and $10^{-4}$ Torr and may preferably be between $1.10^{-5}$ Torr and $5.10^{-5}$ Torr. However, according to embodiments of the invention, higher or lower pressures may also be used. The deposition rate of GaN may be between 10 nm/h and 2000 nm/h, preferably between 180 nm/h and 690 nm/h, depending on the deposition parameters such as pressure, temperature and gas flow. However, according to embodiments of the invention, lower or higher deposition rates may also be possible. The thickness of the GaN layer 5 depends on the deposition rate and the deposition time and may be between 0.5 nm and 1 cm, preferably between 0.5 nm and 100 µm, more preferably between 0.5 nm and 10 µm, or even more preferably between 0.5 nm and 1000 nm, between 0.5 nm and 500 nm, between 0.5 nm and 100 nm, between 0.5 nm and 20 nm, between 0.5 nm and 10 nm, between 0.5 nm and 2 nm, or may have a thickness corresponding to between 1 and 5 monolayers. The deposition time required is determined by the deposition rate and by the required thickness for the GaN layer 5 for particular applications.

According to embodiments of the invention, the GaN layer 5 may be doped. This may be done during deposition or growth of the GaN layer 5. Efficient n- and p-type doping is of importance for the fabrication of electronic devices. Doping of the GaN layer 5 may be achieved by introducing foreign elements into the GaN during growth or afterwards by, for example, ion implantation. Examples of elements for doping GaN are Si for forming n-type GaN or Mg for forming p-type GaN. It has to be noted that p-GaN is difficult to grow or deposit because of a high n-type background doping density (non intentionally) which must be compensated for. As it is hard to make p-GaN, it is difficult to realise a p/n-GaN junction. It is also difficult to make a p/n heterojunction comprising an n-GaN layer on a p-type material due to structural differences. As the method according to embodiments of the invention makes it possible to deposit high quality n-GaN on a Ge substrate, a p/n heterojunction, e.g. n-GaN/p-Ge, with high quality can be made.

With the method according to embodiments of the invention, GaN layers 5 with good crystal quality can be deposited. This is concluded from X-ray diffraction (XRD) omega and XRD omega-2theta scan experiments (see further). For example, for GaN layers 5 with a thickness of e.g. 40 nm, XRD full widths at half maximum (FWHM) of the omega scan may be between 100 and 1000 seconds, preferably between 200 and 700 seconds and more preferably between 300 and 600 seconds. Low XRD FWHM values indicate a good nicely repeated crystal structure. Hence, the lower these XRD FWHM values are, the better the crystal quality of the GaN layer 5 will be and the more suitable the GaN/Ge structure formed will be for use in e.g. semiconductor devices. This is because of the better electrical properties due to higher electron mobility. For thick GaN layers 5 of a few microns thickness deposited on Si or on sapphire according to prior art methods XRD FWHM values of the omega scan of 300 to 600arcseconds have been measured. For the purpose of comparison, for bulk GaN layers 5 (not on a supporting substrate of a different material) with a thickness of a few 100 µm XRD FWHM values of 200 to 300 can be obtained.

Furthermore, fringes are visible in the omega-2theta scan indicating good interface quality between the GaN layer 5 and the Ge of the substrate 1. As the formed GeN layer 4 is very thin, i.e. it may preferably be as thin as about 1 or 2 monolayers, it cannot be detected by an omega-2theta scan. The GeN layer 4 can be measured with XPS when a nitridated substrate is taken out of the chamber in which nitridation has been performed before subsequent GaN deposition has taken place. When the GaN is grown, this GeN layer 4 may become thinner or partly disappear. Nevertheless, there will always be at least 1 monolayer of GeN left which connects the Ge substrate 1 with the GaN layer 5. A crystal quality comparable to or better than GaN grown on Si with intermediate layer(s) and GaN on Sapphire with intermediate layer(s) in between the GaN and the substrate was found. Thick GaN layers of a few micrometers thickness on Si and on sapphire show values for XRD FWHM of the omega scan of 300 tot 600 arcseconds. For the purpose of comparison, for bulk GaN substrates (not on a supporting substrate of a different material) of a few 100 µm thickness XRD FWHM values of 200 to 300 can be obtained.

Figure 13:
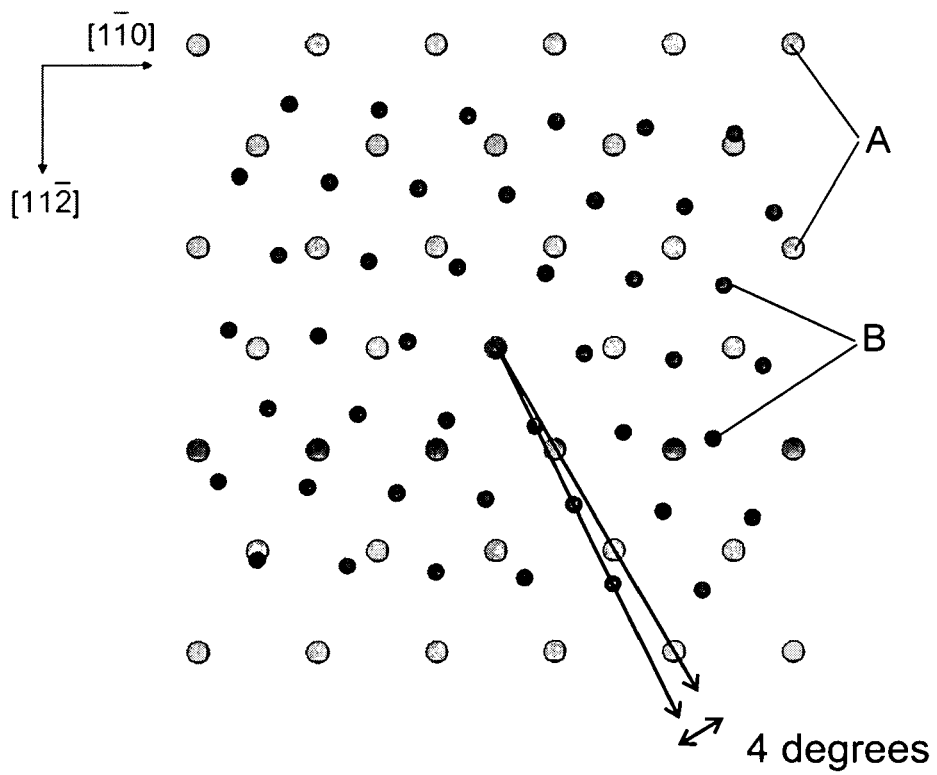
FIG. 13 is a schematic representation showing misorientation of one grain of GaN relative to a Ge substrate.

From table 1 it could be seen that the theoretical lattice mismatch between GaN and Ge is very large, i.e. −20.3%. However, GaN layers 5, deposited by the method according to embodiments of the invention, show good quality. This is because of the formation of a GeN layer 4 on the Ge surface of the substrate 1 before deposition of the GaN layer 5. As already discussed before, the GeN layer 4 takes the same in-plane lattice parameter as the top Ge layer 3 on which it is formed. In case of GaN a rotation of the GaN lattice with 4 degrees in the plane of the growth surface is observed. This allows the GaN layer 5 to fit on top of the Ge surface which has a hexagonal symmetry. This further facilitates growth of GaN layers 5 with good crystal quality because it minimises the energy to form GaN on Ge. This rotation is also referred to as misorientation. FIG. 13 shows the misorientation of one grain of GaN relative to Ge of a Ge substrate 1. The big circles indicated with A represent Ge atoms and the smaller circles indicated with B represent Ga atoms. The GaN is rotated over 4 degrees in plane, as indicated in FIG. 13. This rotation may allow the GaN lattice to fit on the Ge lattice with minimal interface energy. This rotation also occurs in the opposite direction. As the Ge surface of the substrate 1 is symmetric, there is no preferential direction for the rotation, i.e. no direction is energetically more favourable. Growth starts at different nucleation sites, with random choice of the direction of the rotation. When growth proceeds, the different nucleation sites grow till they touch each other. This results in a layer having two different orientations for the grains. Hence, the occurrence of the rotation of the GaN lattice with respect to the Ge lattice also has a drawback, i.e. two rotated phases are obtained, one phase rotated clock wise and the other counter clock wise. Still a better crystal quality would be obtained when only one phase was formed. By using off-cut Ge(111) substrates the formation of two phases can be suppressed resulting in 1 phase of GaN (see further).

An advantage of the method according to embodiments of the invention is that it does not require additional deposition of intermediate layers between the substrate 1 and the GaN layer 5 and hence, processing time and costs can be decreased.

Furthermore, the nitridation step in the method according to the invention may be performed in a same deposition chamber as where the deposition of the GaN layer 5 takes place. Moreover, no extra provisions have to be taken because a nitrogen gas flow provision means is present anyhow as it is also used during deposition of the GaN layer 5.

Another advantage of being able to deposit GaN onto substrates 1 having at least a Ge top surface 3 comes from the fact that Ge is a semiconductor which can be n- or p-doped. Because of that, the possibility of growing or depositing GaN onto substrates 1 comprising at least a Ge top surface 3 allows using these substrates 1 as back contact in, for example, semiconductor devices, e.g. vertical semiconductor devices. Ohmic contacts should be provided on the Ge when devices are made. The ohmic contact to the Ge can be made from the top of the structure, i.e. from the side of the structure where the GaN layer 5 has been deposited, and/or at the backside of the structure. In case the contacts are made from the top of the structure, the GaN layer 5 deposited on the Ge should be removed, e.g. should be etched away. For example, a junction formed between a n-GaN layer 5 and a p-Ge substrate 1 may be used for a diode structure or may be used in a Heterojunction Bipolar transistor (see further). First, the Ge substrate 1 can be used for back-contacting devices formed on top of this substrate 1. When a conducting support 2 is used with a Ge layer 3 on top as a template for GaN growth, this conducting support 2 such as e.g. doped GaAs, doped Si, . . . , can be used to contact the Ge top layer 3 which can be part of a device, or the support 2 can be used to contact the Ge top layer 3 which can be used to contact a device on top. Secondly, a heterojunction device can be made that uses the heterojunction between GaN en Ge. This heterojunction device can be contacted from the back or from the top.

To conclude, growth of a GaN layer 5 on substrates 1 comprising at least a Ge top surface 3 with a hexagonal or six-fold symmetry using to the method according to embodiments of the invention is advantageous because of the small thermal mismatch between GaN and Ge, as well as between Ge and AlGaN, InGaN and InAlGaN with high Ga content. Furthermore, the thermal mismatch of all III-nitrides with respect to Ge is negative. This means that the stress originating from the thermal mismatch is compressive, which does not lead to cracking of the III-nitride layer. This is contrary to the case where the stress would be tensile, because tensile stress would lead to cracking of the III-nitride layer, in the example given GaN layer 5. Compressive stress, however, may lead to cracking of the substrate but the strength of the Ge substrate may prevent this. However, in case of GaN, and InGaN or AlGaN with high Ga content, the thermal mismatch is small, so the compressive stress will also be small and cracking of the substrate will not happen.

Another advantage of using a Ge substrate 1 is the possibility of uniformly heating the Ge and the relatively low price of Ge. The method according to embodiments of the invention is even more advantageous because deposition of intermediate layers between group III-nitrides, e.g. GaN, and the Ge of the substrate 1 can be avoided. Furthermore, the method according to embodiments of the invention allows making a device that uses a heterojunction between e.g. n-GaN and p-Ge and also allows making back-contacts to devices.

As already described above, the presence and properties of the thin GeN layer 4 on the substrate 1 make sure that the GaN layer 5 deposited or grown onto the substrate 1 has a good crystal quality. The thin GeN layer 4 has no electrical influence. The GeN layer 4 is very thin, i.e. preferably only 1 or 2 monolayers thick, and may be considered as a transition between Ge and GaN wherein nitrogen binds to the Ge of the substrate 1 at one side and to the Ga of the GaN layer 5 at the other side.

Because the GaN layer 5 obtained by the method according to embodiments of the present invention has such good crystal quality, at least one extra layer of other materials, such as other nitride materials (e.g. group III-nitrides), oxides, metals, or insulators (e.g. oxides, nitrides, organic insulators, . . . ) may be grown or deposited on top of the GaN layer 5. Also amorphous semiconductors, such as amorphous Ge, can be grown on the GaN layer 5. According to embodiments of the invention, only one extra layer may be deposited on the group III-nitride layer, e.g. GaN layer 5. However, according to other embodiments of the invention, a plurality of extra layers with e.g. different functionalities may be deposited on the group III-nitride layer, e.g. GaN layer 5. This allows making different devices. Preferably, other materials which may be grown onto the GaN layer 5 may be group III-nitrides such as, for example, AlN, InN, AlGaN, InGaN, InAlGaN, AlGaN with a low Al concentration (below 50%), InGaN with a high In concentration (higher than 25%). According to embodiments of the present invention, InGaN, AlGaN and InAlGaN with any content of Ga and In or Al may be used to form the at least one extra layer. It has to be noted that in case of AlGaN with Al contents higher than 50% the quality will be lower. The reason for this is that the more Al is present in the alloy the higher the preferred growth temperature will be. The growth temperature is limited in the MBE growth process to about 940° C.

In the case that at least one extra layer is provided on the GaN layer 5, the GaN layer 5 may be very thin, for example between 0.5 nm and 20 nm, between 0.5 nm and 10 nm, between 0.5 nm and 2 nm, or may have a thickness corresponding to between 1 and 5 monolayers. According to other embodiments of the invention, also thicker GaN layers 5 may be deposited.

For use in applications and/or to make semiconductor devices, the GaN layer 5 obtained by the method according to embodiments of the invention may also be patterned. The other materials which may be deposited onto the GaN layer 5 may, if the application so requires, also be patterned. Patterning may be done by any suitable technique known by a person skilled in the art, such as e.g. lithography.

Because, as already mentioned above, p-GaN is difficult to grow, making a p-n junction of GaN is thus very difficult. Making use of the p-n hetero-junction between GaN and Ge, a structure can be made which can be used on, for example, light detectors, pn junction diodes, heterojunction bipolar transistors, solar cells, LEDs and other devices.

Figure 2:
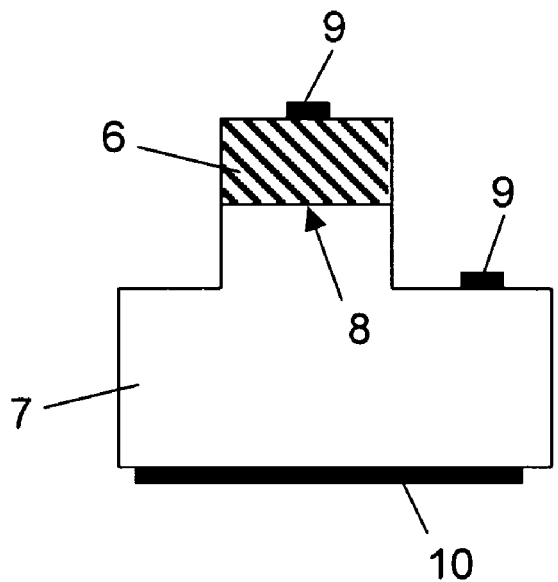
FIG. 2 illustrates a junction diode made of n-GaN on p-Ge according to embodiments of the present invention.

In FIG. 2 a pn junction diode made of an n-GaN layer 6 on a p-Ge substrate 7 is illustrated. The n-GaN layer 6 and part of the p-Ge substrate 7 may then be etched as illustrated in FIG. 2. The pn junction is formed at the interface 8 between the n-GaN layer 6 and the p-Ge substrate 7. Ohmic contacts 9 may be provided to the n-GaN layer 6 and the p-Ge substrate 7. Another or additional possibility for contacting the device is by providing a backside ohmic contact 10 to the p-Ge substrate 7.

Figure 3:
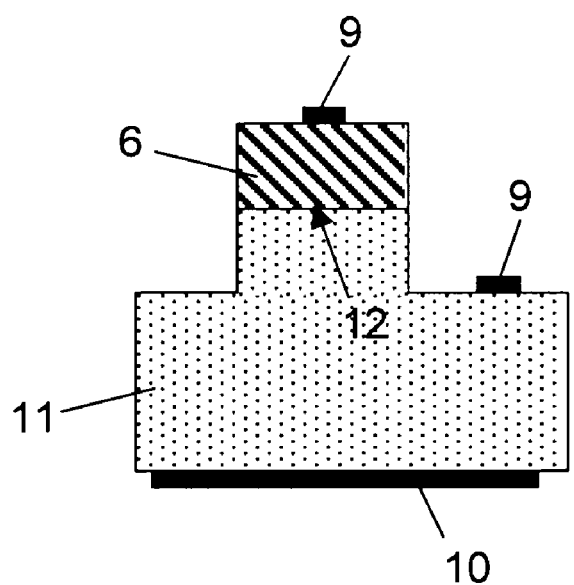
FIG. 3 illustrates a junction diode made of n-GaN on n-Ge according to embodiments of the present invention.

Another example is illustrated in FIG. 3 which shows a junction diode made of an n-GaN layer 6 deposited onto an n-Ge substrate 11. An nn-heterojunction is formed at the interface 12 between the n-GaN layer 6 and the n-Ge substrate 11. Similar as in the junction diode illustrated in FIG. 2 contacting of the junction diode in FIG. 3 may be made possible by providing ohmic contacts 9 to a front side and ohmic contacts 10 to a backside of the n-Ge substrate 11.

Figure 4:
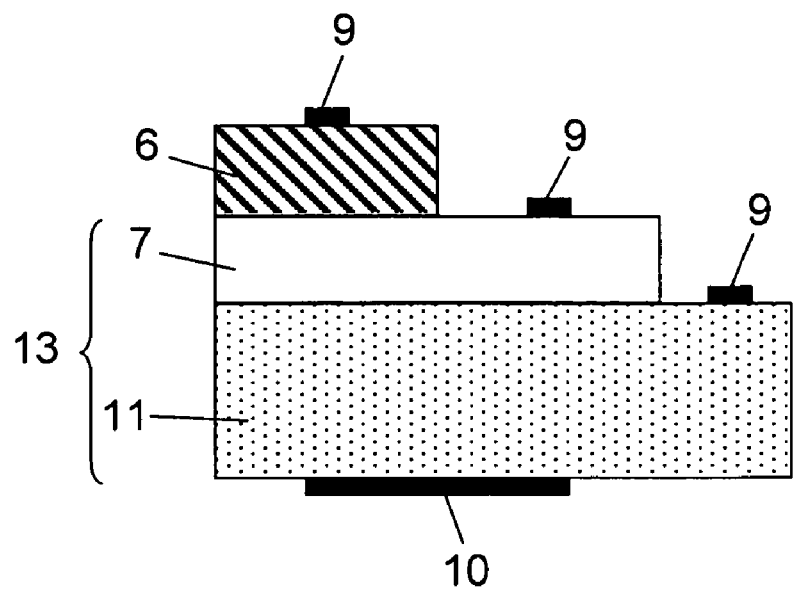
FIG. 4 illustrates a Heterojunction bipolar transistor (HBT) according to embodiments of the present invention.

A further example is illustrated in FIG. 4 where a heterojunction bipolar transistor (HBT) is shown. The HBT may comprise a substrate 13 formed of an n-Ge layer 11 and a p-Ge layer 7 on top of the n-Ge layer 11. On the substrate 13, an n-GaN layer 6 may be provided. The n-GaN layer 6 may function as emitter of the HBT, the p-Ge layer 7 may function as base of the HBT and the n-Ge layer 11 may function as collector of the HBT. Again, ohmic contacts 9 and 10 may be provided to the HBT device for contacting the different layers in the device. The n-Ge layer 11 can be contacted from the backside via ohmic contact 10 and/or from the front side by etching away part of the n-GaN layer 6 and part of the p-Ge layer 7 and making an ohmic contact 9 to the front side of the n-Ge layer 11.

By using, for example, another semiconductor material or another conductive material in contact with Ge or GaN, other HBT structures may be made using the method according to embodiments of the present invention. For example, an n-GaN layer 6 may be deposited or grown on a p-Ge layer 7 that lies on top of a n-Si layer for forming another type of HBT structure. Another example may be an insulating GaAs substrate with an n-doped GaAs layer on which there is a p-Ge layer and finally an n-GaN layer (not shown in the figures). Another possibility may be an n-GaAs substrate with a p-Ge layer on which there is an n-GaN layer.

Other applications could be, for example, GaN passivation of Ge solar cells, Ge transistors or other devices. Direct Photo Electrolysis may also be possible, such as for the formation of InGaN on a GaN/Ge structure or an InGaN/Ge structure formed by the method according to embodiments of the invention. Applications for solar cells can, for example, comprise a structure of (n-)InGaN on a thin GaN layer on a p-Ge substrate formed by the method according to embodiments of the invention, where the hetero-junction between InGaN/GaN and Ge may then be used for separating generated electron-hole pairs. An other example for an application for solar cells may comprise an (n-)InGaN layer on a p-Ge substrate formed by the method according to embodiments of the invention, where the hetero-junction between InGaN and Ge may then be used for separating generated electron-hole pairs. Furthermore, light detectors can be made, for example by depositing an n-GaN layer on a p-Ge substrate. LEDs can be made, such as highly doped n-GaN on p-InGaN with or without a GaN buffer layer on a p-Ge substrate, p-InGaN with or without a thin GaN buffer layer on a highly doped n-Ge substrate, n-GaN on p-GaN on, a p-Ge substrate, . . . . It should however be noted that p-InGaN is even more difficult to grow than p-GaN, because of a higher unintentional background carrier concentration.

The possibility to deposit or grow GaN layers 5 on substrates 1 comprising at least a Ge top layer 3, preferably with hexagonal or six-fold symmetry, allows the integration of devices made of or comprising Ge and devices made of or comprising III-nitrides.

Hereinafter some examples will be described for the purpose of illustrating the method according to embodiments of the invention. These examples are not intended to limit the invention in any way.

EXAMPLE 1

According to a first example, a GaN layer 5 was grown onto a Ge(111) substrate 1 and the crystal quality was studied. First, the Ge(111) substrate 1 was cleaned to remove, for example, oxides and/or organic materials which may be present at the surface of the substrate 1. Cleaning was done by chemical cleaning. After cleaning, the Ge(111) substrate 1 was loaded in the MBE system and outgassed while it was heated to about 550° C. Prior to growth of the GaN layer 5, the Ge surface 3 of the substrate 1 was exposed to a nitrogen gas flow at a nitridation temperature between 550° C. and 750° C. This allows a thin GeN layer 4 to be formed, which then enables crystalline growth of GaN layer 5. After the creation of the GeN layer 4, GaN was deposited by providing a Ga source flow next to the nitrogen gas flow at different deposition temperatures between 550° C. and 800° C. for different experiments, in order to determine optimal growth conditions.

According to the present example, plasma-assisted MBE is used and thus the nitrogen source for the nitrogen gas flow may, according to the present example, be formed by a nitrogen plasma. The nitrogen gas flow and the Ga flux may, as already mentioned, preferably have a comparable atomic flux. During deposition, the pressure in the deposition chamber was in the order of $10^{-5}$ Torr. The deposition rate was in the order of 180 to 690 nm/h. Different GaN layers 5 with thicknesses between 1.5 nm en 450 nm were deposited.

During growth, the surface morphology and crystal quality of the different GaN layers 5 have been studied with Reflection High Energy Electron Diffraction (RHEED). The grown GaN layers 5 were then afterwards studied with XRD omega-2theta scan and omega scan.

In a first experiment, a thin GaN layer 5 of ~10 nm was deposited or grown at a deposition temperature of 550° C. On top of this thin GaN layer 5 a thicker GaN layer of ~310 nm was deposited at a higher temperature of 750° C.

In a second set of experiments, a thin GaN layer of ~35 nm was deposited at a temperature of 750° C. On top of this layer a thicker GaN layer of ~290 nm was deposited at different temperatures below the deposition temperature of the thin GaN layer, i.e. at ~550° C., ~620° C. and ~690° C. Growth at a temperature of ~800° C. (i.e. above the temperature: of the thin GaN layer) was also performed but the crystal quality of the resulting layer was not better than for the sample grown at 750° C.

From these experiments it can be concluded that a GaN layer 5 with the best crystal quality was obtained when both the thin and the thicker layer were deposited at higher temperatures, i.e. at 750° C. It was observed that the higher the deposition temperature is, the better the crystal quality of the resulting layer is. However, at deposition temperatures above 750° C. the crystal quality of the deposited layers does not substantially improve anymore. Furthermore, when the GaN layer 5 is deposited at too high temperatures, RHEED indicates that the surface can roughen.

When GaN growth starts, the RHEED diffraction pattern showed a smooth transition from Ge streaks towards GaN streaks in a few tens of seconds. During the transition no roughening of the surface is observed. The RHEED streaks stay smooth and do not show spots, indicating a smooth surface. This indicates that the GaN lattice fits well on top of the Ge crystal. This is because of the presence of the thin GeN layer 4, which may preferably only be 1 to 2 monolayers thick. The distance between the main streaks visible in the RHEED diffraction pattern does not change when the Ge is nitridated. This indicates that the GeN layer 4 that is formed has the same in-plane lattice parameters as the Ge of the substrate 1 underneath. This result is in contradiction with expectations based on the theoretical lattice mismatch between GaN and Ge being −20.3%. From this large lattice mismatch, roughening would be expected to be seen during RHEED experiments at the start of GaN growth.

The distance of the RHEED streaks changes abruptly at the start of GaN growth. From an analysis of the distance between the streaks of GaN and the Ge lattice, an in-plane lattice parameter of 3.20 (±0.02) Ư could be extracted in case of a thin GaN layer 5 of about 40 nm grown on top of the substrate 1. This indicates that the GaN is not stressed and that the GaN grows relaxated from the beginning. This is a good sign because defects occur when a layer is stressed in order to relieve that stress.

In Table 2 results with respect to the crystal quality are shown for a thin layer of 38 nm of GaN on Ge(111).

TABLE 2

Experimental results for a 38 nm thick GaN layer on a Ge(111) substrate.

| Growth | Integrated peak intensity GaN (%) | FWHM Ω GaN (s) | FWHM Ω/2θ GaN (s) | FWHM Ω/2θ Ge (s) | Thickness GaN nm |
|---|---|---|---|---|---|
| sample | 2.1 | 371 | 396 | 58 | 38 |

Figure 5:
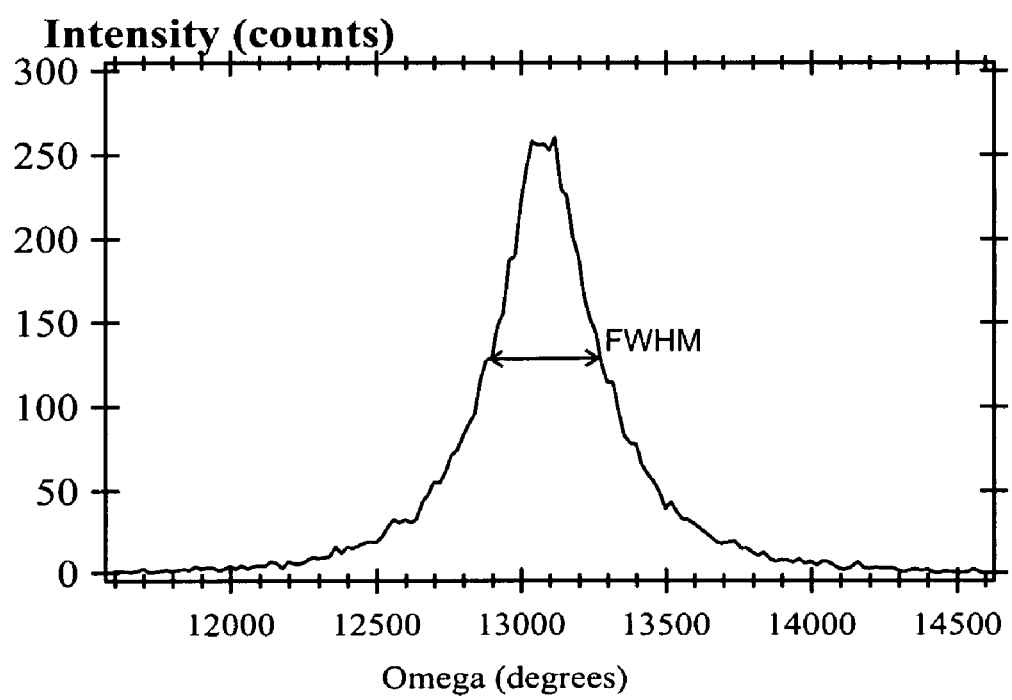
FIG. 5 shows an XRD omega scan for a GaN layer of 38 nm deposited on a Ge (111) substrate.

For the example of a 38 nm thick GaN layer 5 on a Ge(111) substrate 1, an XRD FWHM value of the omega scan was determined to be only 371 arcseconds (see FIG. 5), which is very good considering the small thickness of this GaN layer 5. The lower the XRD FHM value is, the better the crystal quality of the GaN layer 5 will be and the more suitable the GaN/Ge structure formed will be for use in e.g. semiconductor devices. This is because of the better electrical properties due to higher electron mobility.

Figure 6:
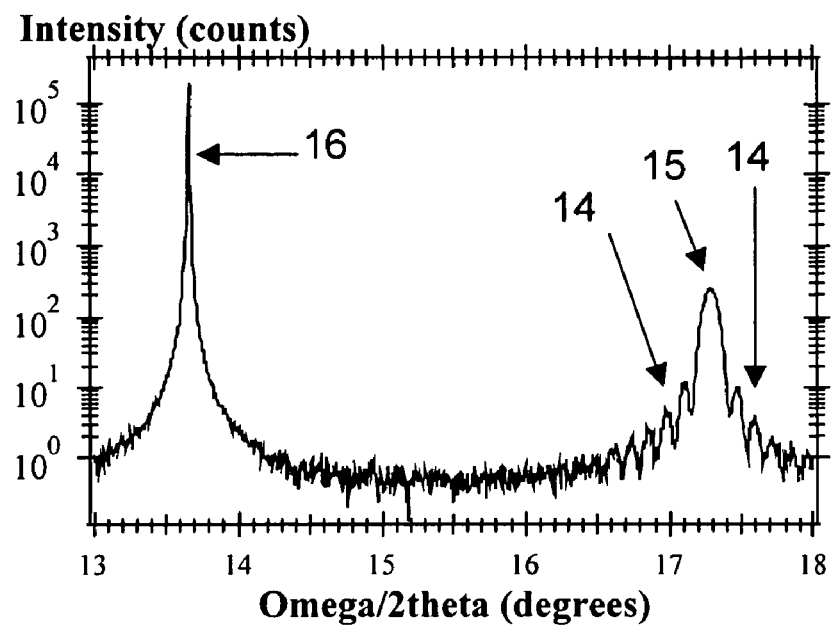
FIG. 6 shows an XRD omega-2theta scan for a GaN layer of 38 nm deposited on a Ge (111) surface.

Thin layer fringes, indicated by reference number 14, are visible in the omega-2theta scan (see FIG. 6). The presence of such fringes 14, also referred to as Kiessig fringes, are indicative for a good interface quality between the GaN layer 5 (indicated by peak 15) and the Ge substrate 1 (indicated by peak 16). The GeN layer 4 is, as already discussed before, preferably not much thicker than a few monolayers and forms a natural transition between Ge and GaN, but is too thin to be observed in XRD experiments.

The GaN layer 5 formed according to the present example has a crystal quality which is comparable to or better than the crystal quality of GaN grown or deposited on a Si substrate with at least one intermediate layer in between the GaN and the substrate and which is comparable to the crystal quality obtained for GaN on Sapphire substrates with at least one intermediate layer (low quality GaN layer grown at low temperature) in between the good quality GaN and the substrate. For GaN on Sapphire average values for the XRD omega scan of 300 arcseconds are obtained and for GaN on Si average values for the XRD omega scan of 600 arcseconds are obtained for thick GaN layers, i.e. for GaN layers 5 with a thickness of higher than 1 micron (see earlier). For thin layers no other substrate can compare to Ge to grow GaN on. Thin layers, such as the 40 nm thick GaN layer 5 of the present example, cannot be grown on Si, Sapphire or SiC with such good quality as is obtained with the method according to embodiments of the present invention for GaN on Ge. For thicker layers, Sapphire gives better quality.

From XRD omega-2theta scan analysis (FIG. 6), an out-of-plane lattice parameter of 5.1897 (±0.0008) Å was found by looking at the position (angle) of the GaN peak 15. This means that, comparing this experimental value with the standard lattice parameter of 5.18524 Å, the GaN layer 5 obtained according to this example is under small compressive stress after growth. This is in agreement with curvature measurements performed on the GaN/Ge structures where a radius of −87 m was measured. This result is in contradiction with expectations based on the theoretical lattice mismatch between GaN and Ge of −20.3%. From this lattice mismatch value a very large tensile stress would be expected.

Figure 7A:
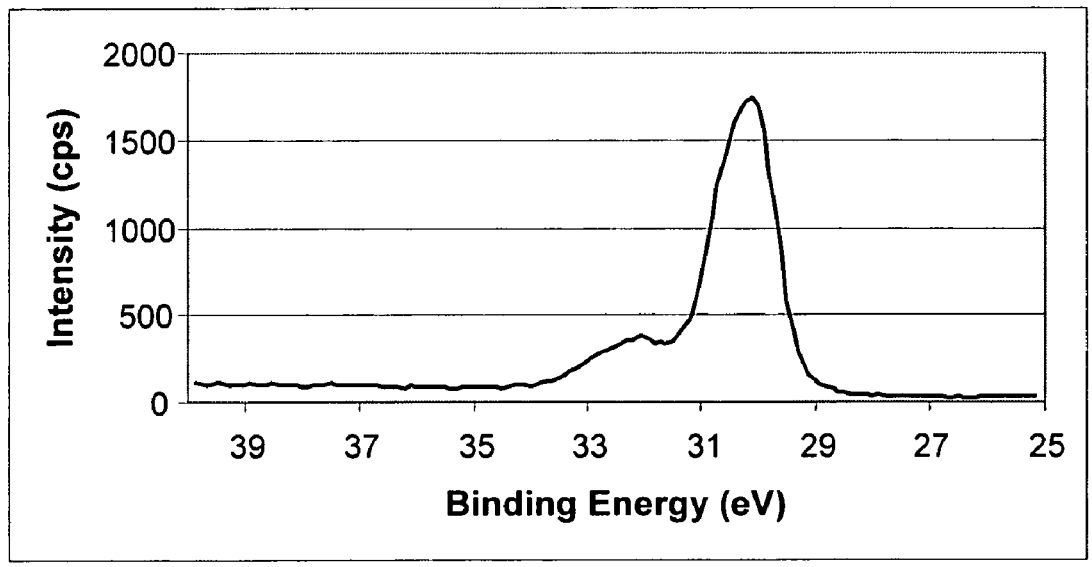
FIG. 7A and FIG. 7B show XPS results of a nitridated Ge(111) substrate.
Figure 7B:
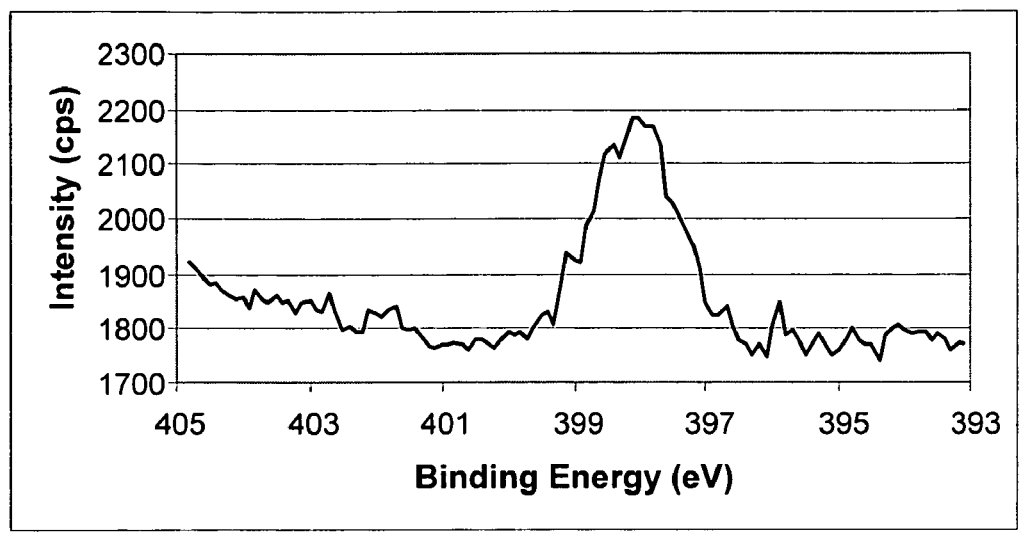

X-ray Photoelectron Spectroscopy (XPS) measurements performed on a nitridated Ge substrate formed according to the first example show a peak for Ge (see FIG. 7A) and GeN (see FIG. 7B). The second, small peak in FIG. 7A just before the Ge peak may be due to a Ge-nitride binding. FIG. 7B proves that this second, small peak is due to a nitride binding because the binding energy coincides with reference nitride binding energy (for WN, BN and NaSCN), which lies between 397 and 398 eV as can be seen from FIG. 7B. FIG. 7A shows a large peak that is due to the Ge substrate (Ge-Ge binding). The small peak in FIG. 7A is due to the binding of Ge and another element. FIG. 7B shows the peak due to the binding of nitrogen with another element. This shows that the small peak in figure A is due to the binding of Ge and N. The peak of the binding of an element, for example Ge, shifts very slightly when it binds with another element. So the peak of Ge bound with N is a little shifted with respect to the peak of Ge bound with Ge.

The size of the peak is indicative for the thickness of the GeN layer. So from the small peak the thickness of the GeN can be estimated. When the smallest peak of the spectrum in FIG. 7A is fitted to $Ge_3N_4$ a thickness of 0.7 nm is found. The measurements illustrated in FIGS. 7A and 7B indicate the formation of a GeN layer 4 in between the Ge substrate 1 and the GaN layer 5.

In Table 3, atomic concentrations found in XPS measurements are represented for a surface of a Ge substrate 1 before and after exposure to a nitrogen gas flow. After exposure both Ge and N are present indicating the presences of a GeN layer 4.

TABLE 3

Atomic concentration measured at 21.88 deg on Ge substrates before (ref Ge) and after exposure to a nitrogen gas flow (GeN/Ge)

|  | C1s | Ge3d | Ge3d O | O1s | N1s |
|---|---|---|---|---|---|
| Ref Ge | 7.99 | 74.79 | 3.48 | 13.73 |  |
| GeN/Ge | 5.95 | 56.5 | 15.66 | 8.02 | 13.87 |

As already discussed before, RHEED experiments show a reconstructed surface when the Ge surface is nitridated. The streaks remain at the same position, indicating that the in-plane lattice parameters stay the same. From XPS experiments it can be concluded that a GeN layer 4 is formed during the nitridation step of the method according to embodiments of the invention. From the RHEED experiments it can be concluded that this GeN layer 4 does not change the in-plane lattice parameters and therefore the GeN takes over the same in-plane lattice parameters as the Ge layer of the substrate 1.

Figure 8:
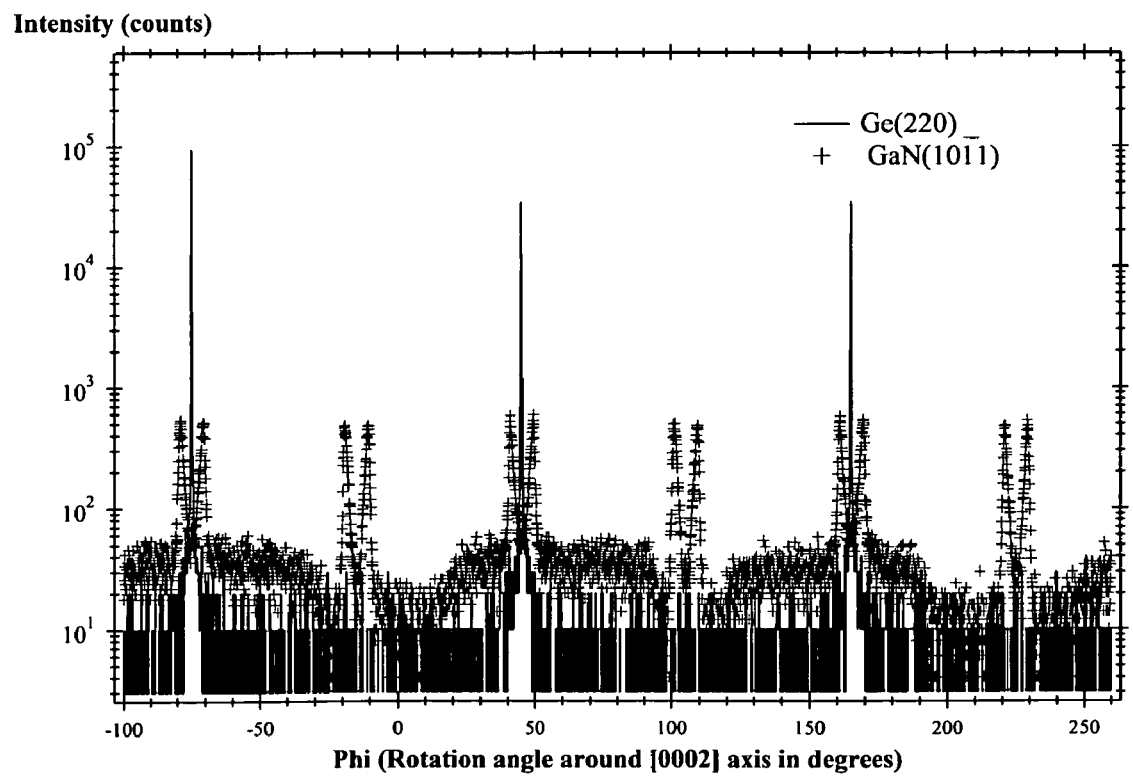
FIG. 8 shows XRD spectra illustrating the rotation of GaN with respect to the Ge crystal.

XRD spectra show a rotation of 4 degrees of the GaN lattice with respect to the Ge lattice (see FIG. 8 and FIG. 13). By rotating the lattices with respect to each other, the lattices match better on each other (see further). The rotation of the GaN and Ge lattices with respect to each other is driven by the minimization of surface and interface energy between the GaN and the Ge.

The formation of a GeN layer 4 prior to GaN deposition or growth and a rotation of the GaN lattice with 4 degrees in the plane of the growth surface (which was measured by TEM and XRD), allows the GaN to fit much better than expected on top of a Ge surface with hexagonal symmetry, as was confirmed by the stress results earlier described. This rotation is illustrated in FIG. 8 which shows XRD spectra illustrating the rotation of GaN with respect to the Ge crystal. The thermal mismatch between GaN en Ge is small (+5.5%) leading to small compressive stress when the sample is cooled down after growth.

Figure 9:
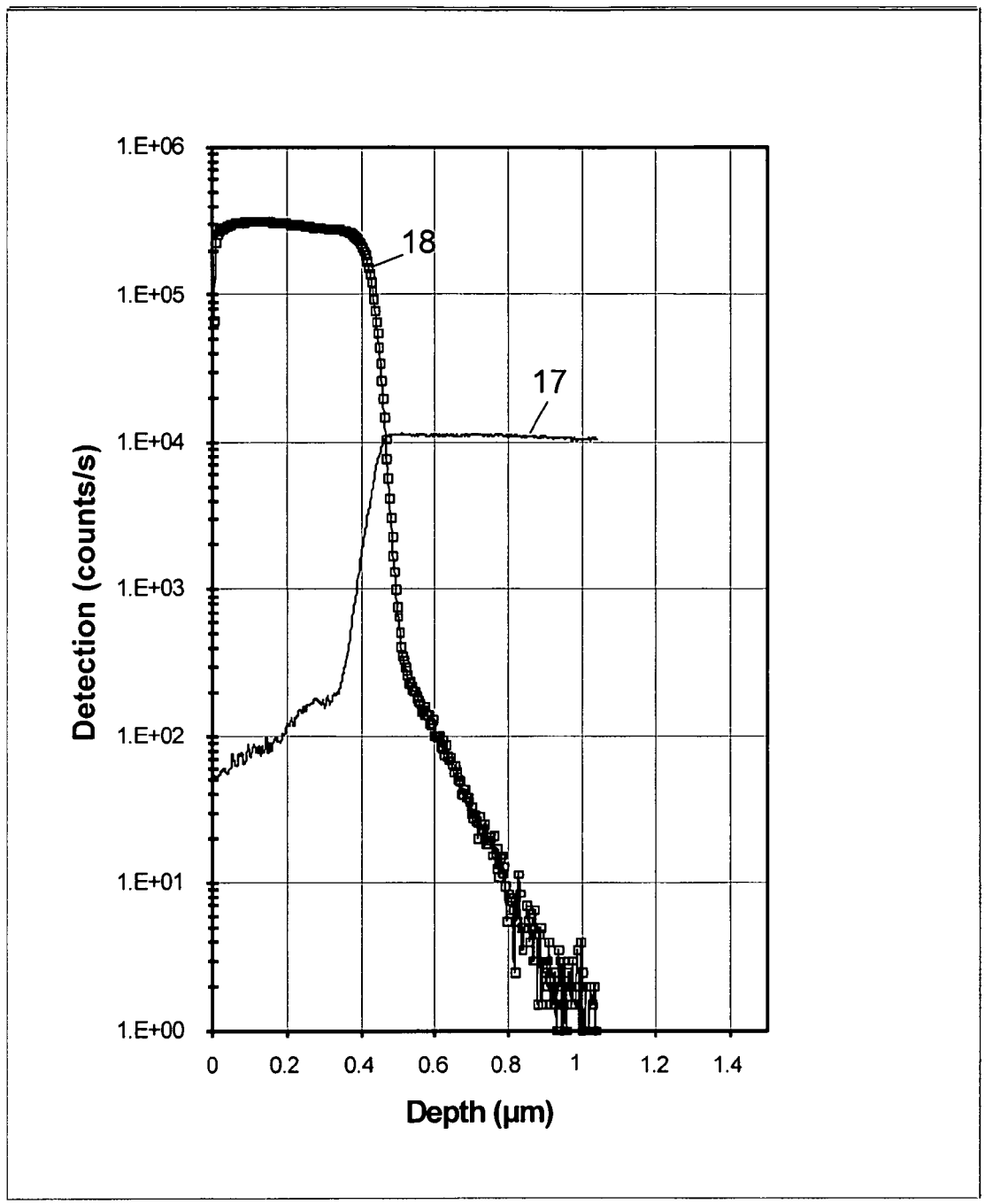
FIG. 9 shows SIMS results for a 450 nm thick GaN layer deposited on a Ge (111) substrate.

SIMS results (see FIG. 9) for a 450 nm thick GaN layer 5 on a Ge substrate 1 shows limited diffusion of Ga atoms into the Ge substrate 1 and Ge atoms into the GaN layer 5. In these graphs, curve 17 shows the Ge profile and curve 18 shows the Ga profile.

From the experiments it can be concluded that the best layer quality may be obtained for thin layers of ~50 nm or less. For thicker layer the quality may be slightly reduced, but is still good. This may be due to the fact that when the GaN layer becomes thicker the surface temperature may change because the GaN differently absorbs heat than the Ge substrate and also the heat conduction may be different. Hence, during growth the surface temperature may change and therefore, optimal required growth parameters may change as well.

EXAMPLE 2

Figure 10:
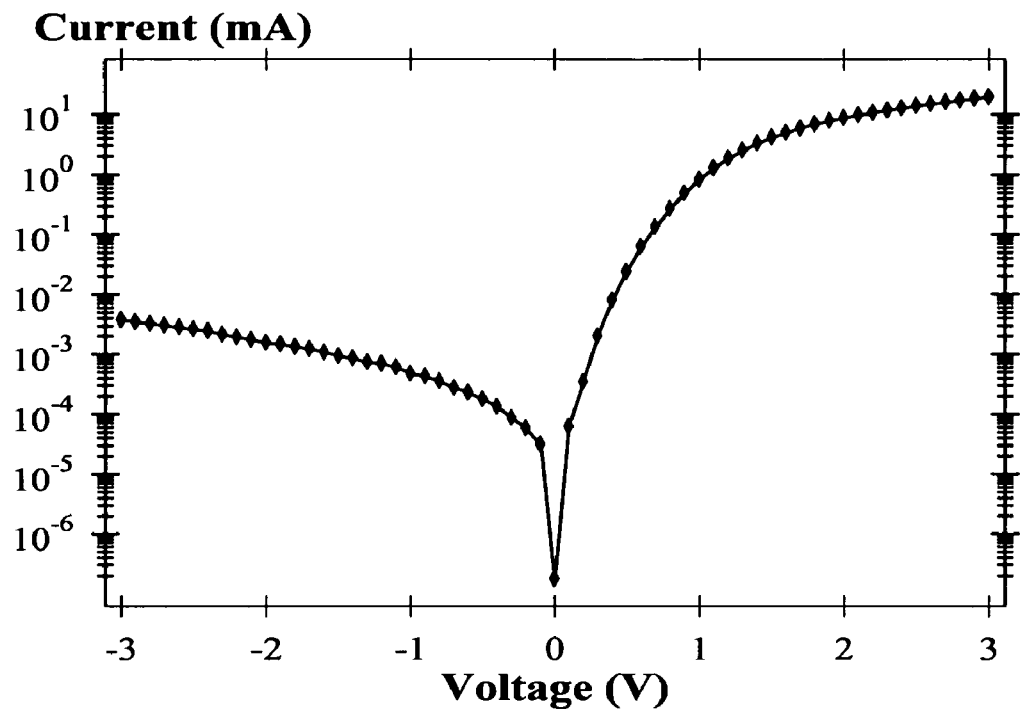
FIG. 10 shows a current-voltage (IV) characteristic for a 450 nm thick GaN layer deposited on a p-Ge (111) substrate measured from top (GaN) to bottom (p-Ge).

According to a second example, an intrinsic n-type (non intentionally doped) GaN layer 5 with a thickness of 450 nm was deposited or grown on top of a p-Ge (111) substrate 1 with a resistance of ~20 Ohm.cm using the method according to embodiments of the invention. A GaN layer 5 was deposited using MBE at a deposition temperature of 760° C. to form a structure similar to the one that is illustrated in FIG. 2. For this structure, an I-V characteristic was measured. Therefore, needles were put on the ohmic contacts 9, 10 on the Ge and GaN (see FIG. 2). The IV curve is illustrated in FIG. 10. A rectifying behaviour can be observed, which is indicative for a good p-n heterojunction between the Ge substrate 1 and the GaN layer 5.

Figure 11:
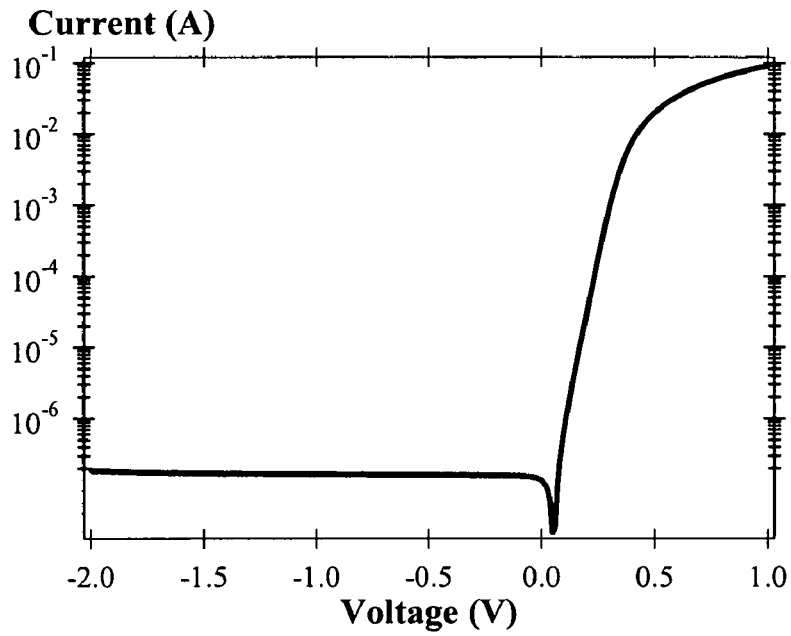
FIG. 11 shows an IV characteristic for a ~200 nm thick n-GaN layer deposited on a n-Ge (111) substrate measured from top (GaN) to bottom (n-Ge).

Further according to the second example, a junction between an n-Ge substrate 11 and an n-GaN layer 6 has been demonstrated. Therefore, an n-GaN layer 6 with a thickness of ~200 nm was deposited or grown on an n-Ge substrate 11 according to embodiments of the present invention to form a structure similar to the one that is illustrated in FIG. 3. Mesa's were etched into the n-GaN layer 6 and the Ge substrate 11 to make structures with well defined sizes. A top ohmic contact 9 was made on the n-GaN layer 6. A backside ohmic contact 10 was also made on the backside of the n-Ge substrate 11, as can be seen in FIG. 3. An I-V measurement was performed on the n-GaN/n-Ge structure having a diameter of 750 μm. Therefore, one needle was connected to the top ohmic contact 9 of the n-GaN/n-Ge structure (at the side of the n-GaN layer 6) and another needle was connected to the backside ohmic contact 10 of the n-GaN/n-Ge structure. The IV characteristic for the ~200 nm thick n-GaN layer 6 on a n-Ge substrate 11 is illustrated in FIG. 11. Again a rectifying behaviour can be observed which is indicative for a good n-n heterojunction between the Ge substrate 11 and the GaN layer 6.

The rectifying behaviour found for the GaN/Ge structures formed in this second example is promising for the use of such structures in e.g. semiconductor device applications where the junction between the Ge substrate and the GaN layer is used.

EXAMPLE 3

Figure 12:
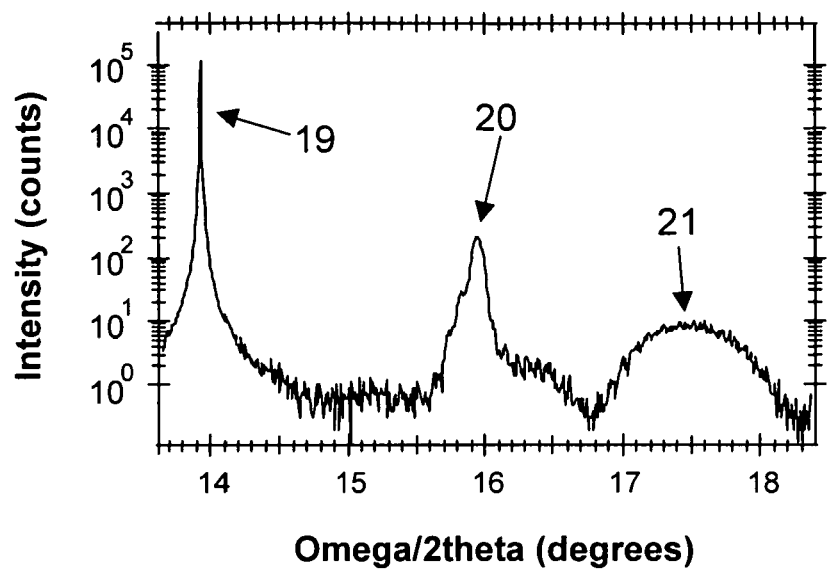
FIG. 12 shows an XRD Omega/2theta scan for a 50 nm thick InN layer on 4 nm thick GaN layer deposited on a Ge(111) substrate.

According to a third example, an InN layer has been grown on Ge using a GaN interlayer, or in other words, an InN layer has been grown on top of a GaN/Ge structure as obtained by the method according to embodiments of the present invention. According to the third example, the GaN layer 5 has a thickness of 5 nm and the InN layer on top of the GaN layer 5 has a thickness of 50 nm. An omega/2theta FWHM of 839 arcseconds and a omega scan FWHM of 903 arcseconds were measured. The rocking curve value is much smaller than reported before for InN on Ge substrates 1, which means that the InN layer deposited on the GaN layer 5 has a good crystal quality. In FIG. 12 the omega/2theta scan is illustrated for the structure formed according to example 3. The omega/2theta scan shows a (111)Ge peak 19, an (002)InN peak 20 and a (002)GaN peak 21 indicating that the In and GaN have good crystal quality. No GeN peak is observed. This is because the GeN layer 4 is preferably only 1 or 2 monolayers thick and can be considered as a binding or transition between two materials, i.e. Ge and GaN, and should, when it is only 1 or 2 monolayers thick, not be considered as a real layer.

EXAMPLE 4

Figure 14:
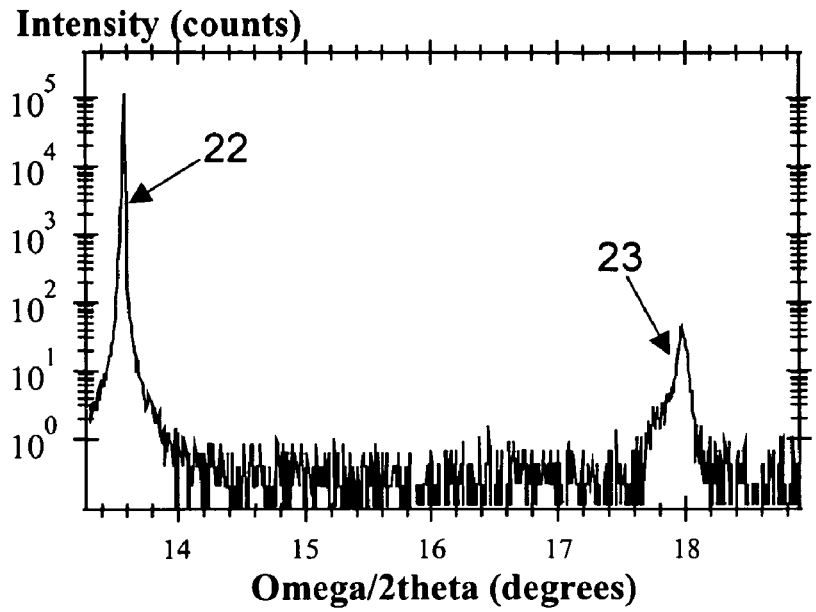
FIG. 14 shows an XRD Omega/2theta scan of a ~97 nm thick AlN layer on a Ge(111) substrate.

In a further example, the growth of AlN on Ge(111) was studied. Therefore, a ~97 nm thick AlN layer was grown on a Ge(111) substrate 1. In FIG. 14, the Omega/2theta XRD scan of such a ~97 nm AlN on Ge(111) is shown. This figure illustrates two peaks, i.e. a Ge peak (indicated with reference number 22) and a AlN peak (indicated with reference number 23). A FWHM of the omega/2theta scan of ~248 arcseconds was found. The FWHM of the omega scan was ~1828 arcseconds. The crystal quality is less when compared to GaN growth on Ge, nevertheless it is proven that crystalline AlN can be grown on Ge using the method according to embodiments of the present invention. This AlN layer was grown onto the Ge(111) substrate 1 using the method according to embodiments of the invention comprising a nitridation step prior to growth of AlN.

EXAMPLE 5

Figure 15:
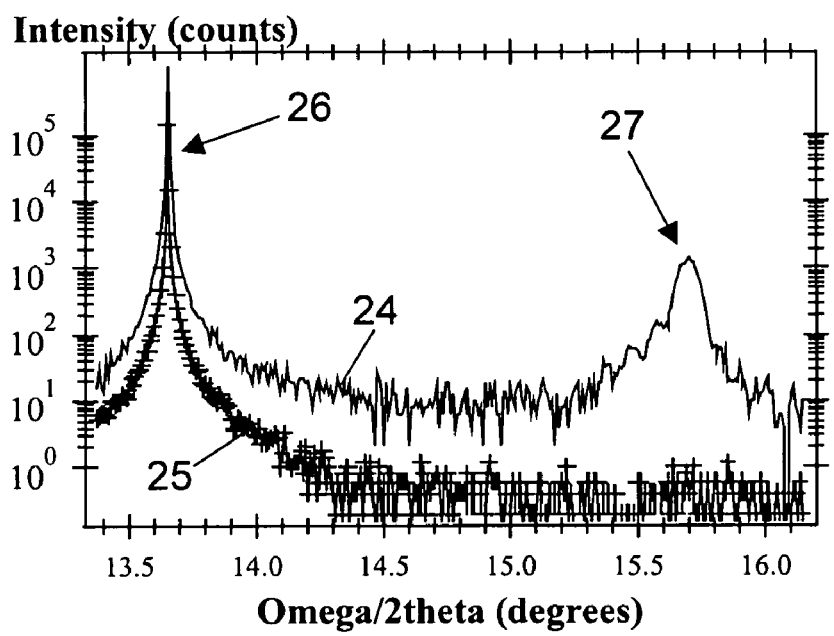
FIG. 15 shows an XRD omega/2theta scan of an InN layer of ~50 nm grown on a Ge substrate with a high temperature nitridation at ~700° C. (curve 24) and without nitridation (curve 25).

It was furthermore illustrated that it is also possible to grow InN on a Ge substrate 1 using the method according to embodiments of the present invention. FIG. 15 shows an omega/2theta scan of an InN layer of ~50 nm grown on a Ge substrate 1 with a high temperature nitridation at ~700° C. before InN growth (curve indicated with reference number 24) and without nitridation before InN growth (curve indicated with reference number 25). For the case where a high temperature nitridation was performed before InN growth, the omega/2theta scan shows two peaks, i.e. a Ge peak (indicated with reference number 26) and an InN peak (indicated with reference number 27). For the case without nitridation before InN growth, only one peak, i.e. a Ge peak 26 is observed.

In both cases, i.e. in the case where nitridation was performed and in the case where no nitridation was performed, the growth of InN was performed at ~250-350° C. Nitridation leads to crystalline InN whereas the process without a nitridation step and thus without formation of a GeN layer 4 in between the substrate 1 and the InN layer 5, leads to amorphous (non-crystalline) InN. This is confirmed by the absence of an InN peak in the omega/2theta scan.

EXAMPLE 6

Figure 16:
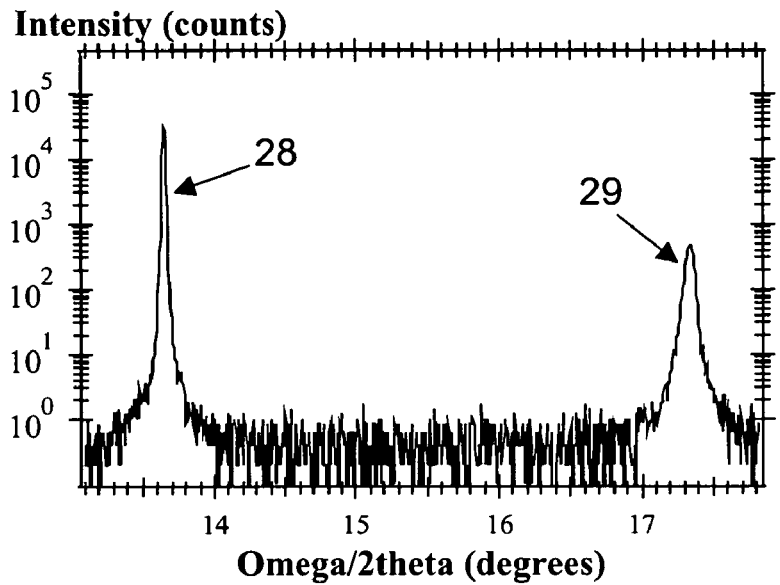
FIG. 16 shows an XRD omega/2theta scan of ~280 nm AlGaN directly grown on a Ge(111) substrate.

In FIG. 16, an omega/2theta scan of a ~280 nm thick AlGaN layer 5 grown on a Ge(111) substrate 1 is shown. The AlGaN layer 5 comprises ~8% Al and ~92% Ga. The growth temperature was ~750° C. and nitridation of the Ge was performed prior to growth. The quality of the AlGaN layer 5 in this case is found to be slightly less than that of GaN layers of comparable thickness, but is still very good. In the omega/2theta scan the AlGaN peak (indicated with reference number 29) moved a little bit to the right when compared to pure GaN because of the extra Al present in the alloy. From this experiment it can be concluded that high quality AlGaN can be grown on a Ge substrate 1 with the method according to embodiments of the present invention.

EXAMPLE 7

Figure 17:
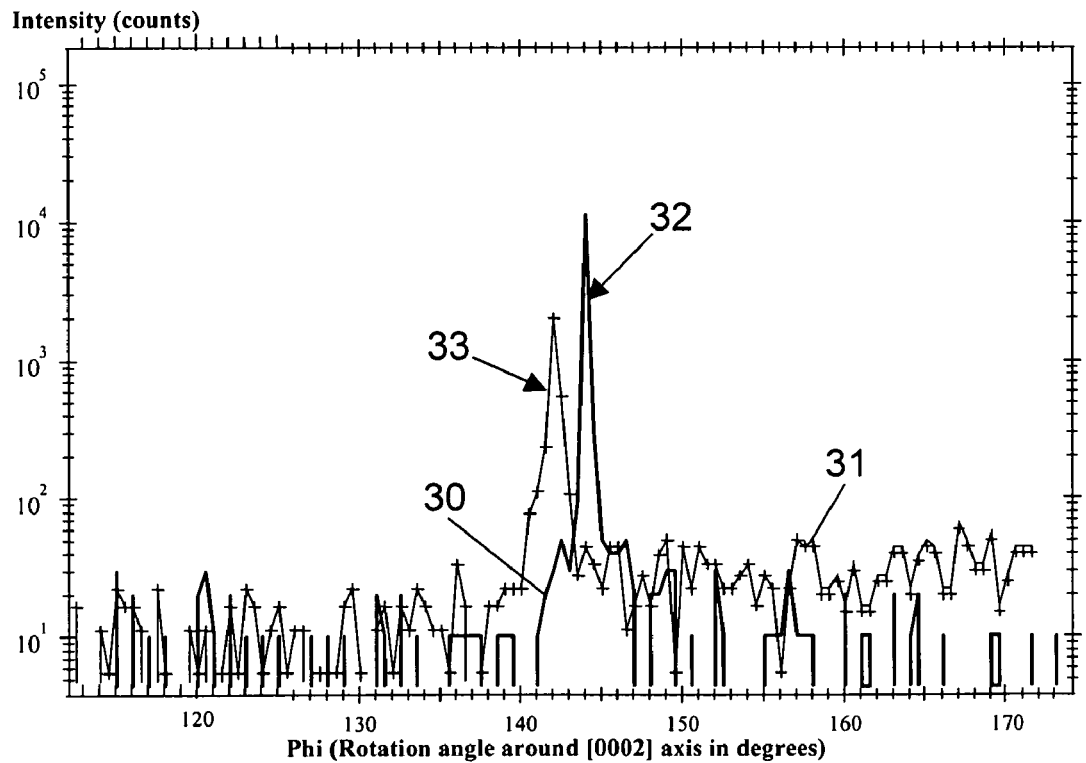
FIG. 17 shows a phi scan of a ~100 nm thick GaN layer on a Ge(111) substrate with ~4.7° misorientation towards (110).

In a last experiment, onto a Ge(111) substrate 1 with ~4.7° misorientation towards (110), a ~300 nm thick GaN layer 5 was grown according to the method according to embodiments of the invention. The substrate temperature and nitrogen gas flow were optimized to achieve good crystal quality. A phi scan around the [0002] axis (see FIG. 17) was performed. The curve indicated with reference number 30 is for Ge(220) (in a phi scan the sample is looked at under a different angle to see rotation of the lattice in the asymmetric plane of growth; whereas for an omega-2theta scan lattice repetition is looked at in the direction of the growth (i.e. substantially perpendicular to the surface) and the curve indicated with reference number 31 is for GaN (1 0 $\bar{1}$ 1). Only one GaN peak (indicated with reference number 33) was observed, instead of two for the on axis Ge(111) substrates 1 (see earlier). Different peaks indicate the presence of different GaN phases (as was discussed before), rotated in the plane of the layer. The fact that there is only one peak indicates that there is only one GaN phase. This shows that off cut Ge(111) substrates 1 can be used to obtain one GaN phase instead of two for the on axis substrates.

It has to be noted that the deposition temperature depends on the kind of group III-nitride that has to be deposited. Fore example, for InN the deposition temperature may preferably be lower than the nitridation temperature whereas for GaN the deposition temperature may be the same of the nitridation temperature.

It is to be understood that although preferred embodiments, specific constructions and configurations, as well as materials, have been discussed herein for devices according to the present invention, various changes or modifications in form and detail may be made without departing from the scope and spirit of this invention.

The invention claimed is:

1. A method for depositing a group III-nitride layer on a substrate, the method comprising:
   heating a substrate having a Ge surface to a temperature of from 400° C. to 940° C., wherein the substrate is exposed to a nitrogen gas flow while heating; and thereafter
   depositing a group III-nitride layer on the Ge surface.

2. The method of claim 1, wherein the Ge surface has hexagonal symmetry.

3. The method of claim 1, wherein the group III-nitride layer is deposited by molecular beam epitaxy.

4. The method of claim 1, wherein the substrate is exposed to the nitrogen gas flow at a temperature of from 400° C. to 940° C.

5. The method of claim 1, wherein the substrate is exposed to the nitrogen gas flow at a temperature of from 100° C. to 940° C.

6. The method of claim 1, wherein the substrate is exposed to the nitrogen gas flow at a temperature of from 550° C. to 850° C.

7. The method of claim 1, wherein depositing the group III-nitride layer is performed at a deposition temperature of from 550° C. to 850° C.

8. The method of claim 1, wherein the group III-nitride layer has a thickness of from 0.5 nm to 100 μm.

9. The method of claim 1, further comprising doping the group III-nitride layer.

10. The method of claim 1, further comprising patterning the group III-nitride layer.

11. The method of claim 1, further comprising depositing at least one extra layer onto the group III-nitride layer.

12. A method according to claim 11, wherein the at least one extra layer comprises a material selected from the group consisting of group III-nitride materials, III-V materials, oxides, metals, insulators, and semiconductor materials.

13. The method of claim 11, wherein the at least one extra layer comprises a material selected from the group consisting of AlN, InN, AlGaN, InGaN, and InAlGaN.

14. The method of claim 11, further comprising patterning the at least one extra layer.

15. The method of claim 1, wherein the method is part of a manufacturing process for making a junction diode.

16. The method of claim 1, wherein heating the substrate having a Ge surface to a temperature of from 400° C. to 940° C., wherein the substrate is exposed to a nitrogen gas flow while heating, yields a GeN layer, wherein the GeN layer is situated between the substrate and the group III-nitride layer deposited thereafter, and wherein the GeN layer is in direct contact with the Ge surface and with the group III-nitride layer.

17. A structure comprising:
   a substrate having a Ge surface;
   a group III-nitride layer; and
   a GeN layer between the substrate and the group III-nitride layer, wherein the GeN layer is in direct contact with the Ge surface and with the group III-nitride layer.

18. The structure of claim 17, wherein the substrate is Ge(111) or off-cut Ge(111) with at least a surface having hexagonal symmetry.

19. The structure of claim 17, wherein the substrate comprises a support with a Ge top layer.

20. The structure of claim 19, wherein the Ge top layer comprises a Ge(111) layer with a surface with hexagonal symmetry layer or an off-cut Ge(111) layer with a surface with hexagonal symmetry.

21. The structure of claim 20, wherein the thickness of the Ge(111) layer or the off-cut Ge(111) layer is from 0.4 nm to 100 μm.

22. The structure of claim 19, wherein the support comprises a material selected from the group consisting of Si, SiC, sapphire, GaAs, off-cut Si(111), and off-cut GaAs(111).

23. The structure of claim 17, wherein a thickness of the group III-nitride layer is from 0.5 nm to 100 μm.

24. The structure of claim 17, wherein the group III-nitride layer is a patterned group III-nitride layer.

25. The structure of claim 17, wherein a full width at half maximum of an x-ray diffraction omega scan of the group III-nitride layer is below 700 arcseconds.

26. The structure of claim 17, further comprising at least one extra layer on the group III-nitride layer.

27. The structure of claim 26, wherein the at least one extra layer comprises a material selected from the group consisting of group III nitride materials, III-V materials, oxides, metals, insulators, and semiconductor materials.

28. The structure of claim 26, wherein the at least one extra layer comprises a material selected from the group consisting of AlN, InN, AlGaN, InGaN, and InAlGaN.

29. The structure of claim 26, wherein the at least one extra layer is patterned.

30. The structure of claim 17, comprising at least a part of a junction diode.

* * * * *